US008374571B2

(12) United States Patent
Motozawa et al.

(10) Patent No.: US 8,374,571 B2
(45) Date of Patent: Feb. 12, 2013

(54) SEMICONDUCTOR INTEGRATED CIRCUIT AND OPERATING METHOD THEREOF

(75) Inventors: Atsushi Motozawa, Kanagawa (JP); Takayuki Tsukamoto, Kanagawa (JP); Tatsuji Matsuura, Kanagawa (JP); Yuichi Okuda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/279,408

(22) Filed: Oct. 24, 2011

(65) Prior Publication Data

US 2012/0119808 A1 May 17, 2012

(30) Foreign Application Priority Data

Nov. 15, 2010 (JP) ................................ 2010-254631

(51) Int. Cl.
*H04B 1/28* (2006.01)
*H04B 1/06* (2006.01)

(52) U.S. Cl. ......................... 455/333; 455/255; 327/270

(58) Field of Classification Search .................. 455/255, 455/313, 333, 334, 344, 556.1; 327/261, 327/269, 270, 291, 295

See application file for complete search history.

(56) References Cited

U.S. PATENT DOCUMENTS 5,173,617 A * 12/1992 Alsup et al. ................... 327/295
7,034,589 B2 * 4/2006 Chao ............................ 327/158
7,555,263 B1 * 6/2009 Rofougaran et al. ......... 455/333
7,616,935 B2 * 11/2009 Fernandez-Corbaton et al. ............................ 455/255

FOREIGN PATENT DOCUMENTS

JP 2001-211098 A 8/2001

OTHER PUBLICATIONS

H. Karibe, Introduction to Design of Contactless IC Card, Nikkan Kogyo Shinbun Ltd., pp. 46-50, Oct. 31, 2005.
N. Takayama, Effects of Null-Point Avoidance Circuit for UHF-Band RFID Reader-Writer Device, 2005 IEICE Communication Society Conference, Program No. B-5-166, p. 566.
C. Dennis Hull et al., A Direct-Conversion Receiver for 900MHz (ISM Band) Spread-Spectrum Digital Cordless Telephone, IEEE Journal of Solid-State Circuits, vol. 31, No. 12, Dec. 1996, pp. 1955-1963.

* cited by examiner

*Primary Examiner* — Quochien B Vuong
(74) *Attorney, Agent, or Firm* — Mattingly & Malur, PC

(57) ABSTRACT

An integrated circuit is equipped with a reception mixer and a signal generator. A multistage delay circuit generates a plurality of clock pulses in response to a reception carrier signal. A phase detection unit detects differences between a voltage level of a specific clock pulse and voltage levels of a predetermined number of clock pulses generated prior to the specific clock pulse to thereby detect a predetermined phase of the specific clock pulse. A selector of a clock generation unit outputs a plurality of selection clock pulse signals respectively having a plurality of phases from the clock pulse signals. A first signal synthetic logic circuit performs logical operations on the selection clock pulses to thereby generate local signals supplied to the reception mixer.

20 Claims, 10 Drawing Sheets

SEMICONDUCTOR INTEGRATED CIRCUIT AND OPERATING METHOD THEREOF

CROSS-REFERENCE TO RELATED APPLICATIONS

The disclosure of Japanese Patent Application No. 2010-254631 filed on Nov. 15, 2010 including the specification, drawings and abstract is incorporated herein by reference in its entirety.

BACKGROUND

The present invention relates to a semiconductor integrated circuit and an operating method thereof, and particularly to a technology effective in generating local signals supplied to a reception mixer without using a PLL circuit having a problem with responsivity.

A so-called IC card equipped therein with a semiconductor integrated circuit and an antenna performs exchange of information between a reader-writer device and the semiconductor integrated circuit and achieves various functions such as transmission of data retained in the IC card, holding of data transmitted from the reader-writer device, etc.

According to the international standard ISO/IEC14443, an IC card having a non-contact interface is called PICC and performs RF communications with a reader/writer device called PCD. Incidentally, ISO is an abbreviation of International Organization for Standardization. IEC is an abbreviation of International Electrical Commission. PICC is an abbreviation of a Proximity Card, and PCD is an abbreviation of a Proximity Coupling Device.

For example, in the type A of the international standard ISO/IEC14443, the communication from the PCD to the PICC has been defined as an encoding system based on a deformation mirror system under a modulation scheme with a modulation depth of ASK100%. In the type B of the international standard ISO/IEC14443, however, the communication from the PCD to PICC has been defined as an encoding system based on an NRZ-L system under a modulation scheme with a modulation rate of ASK10%. Incidentally, NRZ-L is an abbreviation of Non Return to Zero-Level. ASK is Amplitude Shift Keying that is one of digital modulation schemes.

A communication technology has recently been in widespread use, which is called a near field communication (NFC) technology and which simplifies wireless communication couplings to household electrical appliances, digital media and consumers, contents and business transactions and spreads them. This NFC technology has compatibility with the existing various communication systems and enables near field communication of the maximum communication rate 847 Kbps at 10 cm or so using an RF frequency of 13.56 MHz. In particular, a cellular phone terminal having built therein an IC card microcomputer (secure chip) having an electronic payment function is equipped with the NFC technology to aim at enhancing convenience for end users by making use thereof for various contactless electronic payments such as a payment for merchandise purchases at a contactless store, a payment for traveling expenses at a station, etc. Incidentally, NFC is an abbreviation of Near Field Communication.

The communication that utilizes ASK modulation between a contactless IC card using this NFC technology and a reader-writer device makes use of electromagnetic coupling between a relatively large loop antenna of the reader-writer device and a relatively small loop antenna of the contacless IC card.

On the other hand, the following Non-Patent Document 1 has described that a communication hole occurs due to the angles of loop antennas of a contacless IC card and a reader-writer device, the distance between them, etc. This phenomenon shows that ASK-modulated amplitude at load modulation is almost unobtainable though the contactless IC card exists within an operating magnetic field range of the reader-writer device, and sufficient RF power is supplied from the reader-writer device to the contactless IC card.

The cause of occurrence of the communication hole results from the fact that when the loop antenna of the contacless IC card is disposed approximately parallel to the peripheral portion of the large loop antenna of the reader-writer device, the directions of two lines of magnetic field generated from the inside and outside of the loop antenna of the reader-writer device are opposite inside the loop antenna of the contactless IC card to thereby cancel out an RF reception signal. Further, the following Non-Patent Document 1 also has described a proposal in which a synthetic vector containing not only the amplitude of a real number but also the amplitude and phase in the direction of an imaginary axis is provided as a solution to the communication hole.

Further, the following Non-Patent Document 2 has described a null-point avoidance circuit that avoids a null point that a detected signal is not obtained due to the relationship of phase between a received signal and local signal (LO) waves where homodyne detection is applied to a reader-writer device for an RFID system. The null-point avoidance circuit detects the received signal by the LO waves different in phase and selectively receives a channel large in detection level. Further, in the null-point avoidance circuit, an RF received signal is supplied to an input terminal of one of two reception mixers, and an LO signal and a phase-shifted LO signal phase-shifted by $\pi/2(90)°$ are respectively supplied to the other input terminal of one reception mixer and the other input terminal of the other reception mixer. An I channel baseband signal from the output of one reception mixer, and a Q channel baseband signal from the output of the other reception mixer are respectively supplied to one input terminal of a selector and the other input terminal thereof through an I channel baseband amplifier and a Q channel baseband amplifier. A baseband signal having a large detected level of either one of an I channel and a Q channel is selected as reception data by the selector and supplied to a control unit. Incidentally, the null point is considered to be a phenomenon substantially similar to the above communication hole.

A direct conversion receiver that executes the same receiving operation as the homodyne receiver described in the Non-Patent Document 2 in principle has been described in the following Patent Document 1. Local signals supplied to two reception mixers and phase-shifted local signals different in phase by 90° are generated from phase-locked loop (PLL) including a voltage-controlled oscillator (VCO). A traditional superheterodyne receiver needs an image elimination filter for interference-wave elimination of an image frequency with frequency conversion, whereas the direct conversion receiver described in the following Patent Document 1 has an advantage that an image elimination filter used as an external component becomes unnecessary.

Further, a direct conversion receiver used in a digital cordless phone has been described in the following Non-Patent Document 3. The Non-Patent Document 3 also has described that a double balance type cross-coupled quad mixer called a Gilbert mixer is generally used for a reception mixer of the direct conversion receiver. In this reception mixer, an analog circuit configuration has been adopted in which a load resistor, two differential pair transistors and a constant current source are coupled in series between a power supply voltage and a ground voltage.

[Patent Document 1] Japanese Unexamined Patent Publication No. 2001-211098

[Non-Patent Document 1]

Hiroshi Karibe "Introduction To Design of Contactless IC Card", Published by Nikkan Kogyo Shinbun Ltd., PP 46-50, Oct. 31, 2005.

[Non-Patent Document 2]

Naohisa Takayama "Effects of Null-Point Avoidance Circuit for UHF-Band RFID Reader-Writer Device", 2005 IEICE Communication Society Conference, Program Number B-5-166, Page 566.

[Non-Patent Document 3]

Christopher Dennis Hull, et al, "A Direct-Conversion Receiver for 900 MHz (ISM Band) Spread-Spectrum Digital Cordless Telephone", IEEE JOURNAL OF SOLID-STATE CIRCUITS, VOL. 31, NO. 12, DECEMBER 1996, PP. 1955-1963.

SUMMARY

Prior to the present invention, the present inventors et al have been involved in the development of an RF reception unit of a semiconductor integrated circuit of an IC card microcomputer equipped with an NFC technology using an RF frequency of 13.56 MHz.

Prior to the present invention, the present inventors et al have decided the adoption of a direct conversion receiver having made unnecessary an image elimination filter being an external component into downconversion from an RF received frequency to a baseband signal frequency in order to reduce the cost of the semiconductor integrated circuit and the number of external components.

Thus, prior to the present invention, the present inventors et al have studied the phase locked loop (PLL) circuit that generates the local signals supplied to the reception mixers of the direct conversion receiver described in the Patent Document 1. The PLL circuit is generally comprised of a crystal oscillator for generating a reference frequency stable to a change in temperature or the like, a reference divider, a phase frequency comparator (PFD), a charge pump circuit, an RF voltage controlled oscillator (RFVCO) and a VCO divider. Local signals each having an accurate frequency can be generated from the PLL circuit by the reference frequency and the division numbers of the two dividers.

As a result of a further study made by the present inventors et al, however, there was revealed a problem that the crystal oscillator for generating the reference frequency was slow in startup speed at the start of communication between the contacless IC card and the reader-writer device. In order to solve the problem, another system that uses the carrier signal of the RF frequency of 13.56 MHz used in the NFC technology as an alternative to the unuse of the crystal oscillator for the generation of the reference frequency was also studied by the present inventors et al prior to the present invention. Since, however, the modulation scheme based on the modulation depth of ASK100% has been adopted for the communication of the type A of the international standard ISO/IEC14443, the value of amplitude of the carrier signal of the RF frequency corresponding to 13.56 MHz taken as the reference frequency signal supplied to the phase frequency comparator (PFD) becomes zero with the timing at the modulation depth of 100%. Thus, another problem that since the PLL circuit becomes an unlocked state during the period in which the value of amplitude of the carrier signal is zero, the recovery time taken until the PLL circuit is brought to a locked state again after the value of amplitude of the carrier signal has been recovered from zero to a predetermined value, is long, has been revealed by the study made by the present inventors et al.

The present invention has been made as a result of the above-described studies made by the present inventors et al prior to the present invention.

An object of the present invention is therefore to generate local signals supplied to a reception mixer without using a PLL circuit having a problem with responsivity.

Another object of the present invention is to improve responsivity at the time that local signals are generated from a carrier signal of an RF frequency with a modulation depth of ASK100%.

The above and other objects and novel features of the present invention will be apparent from the description of the present specification and the accompanying drawings.

A typical one of the inventive aspects of the invention disclosed in the present application will be briefly described as follows:

A typical embodiment of the present invention is a semiconductor integrated circuit equipped with a reception mixer (2), and a signal generator (3) which generates local signals (LO_I and LO_Q) supplied to the reception mixer.

The reception mixer is supplied with an RF received signal and the local signals and hence the reception mixer generates reception mixer output signals.

The signal generator (3) has a multistage delay circuit (32), a phase detection unit (33) and a clock generation unit (34).

The multistage delay circuit (32) generates a pulse train including a plurality of clock pulse signals (tap0, 1, 2 through 8) different from each other in phase timing by a predetermined delay time (τ) in response to a carrier signal (Cr) included in the RF received signal.

The phase detection unit (33) detects differences between a, voltage level ("L") of a specific clock pulse signal (tap8) generated in the pulse train generated from the multistage delay circuit, and voltage levels ("H") of a predetermined number of clock pulse signals (tap0, 1, 2 through 7) generated prior to the specific clock pulse signal to thereby detect that the specific clock pulse signal has a prescribed phase (180°) and generate a detection output signal.

The clock generation unit (34) includes a selector (341) and a first signal synthetic logic circuit (342, 343).

The selector outputs a plurality of selection clock pulse signals (tap0, 2, 4, 6) respectively having a plurality of previously-selected phases (0°, 45°, 90°, 135°) from the clock pulse signals generated from the multistage delay circuit in response to the detection output signal generated from the phase detection unit.

The first signal synthetic logic circuit performs logical operations (EX-OR) on the selection clock pulse signals outputted from the selector to thereby generate the local signals supplied to the reception mixer (refer to FIGS. 2, 3, and 4).

An advantageous effect obtained by a typical one of the invention disclosed in the present application will be briefly explained as follows:

According to the present invention, local signals supplied to a reception mixer can be generated without using a PLL circuit having a problem with responsivity.

DETAILED DESCRIPTION

1. Summary of the Embodiments

Figure 1:
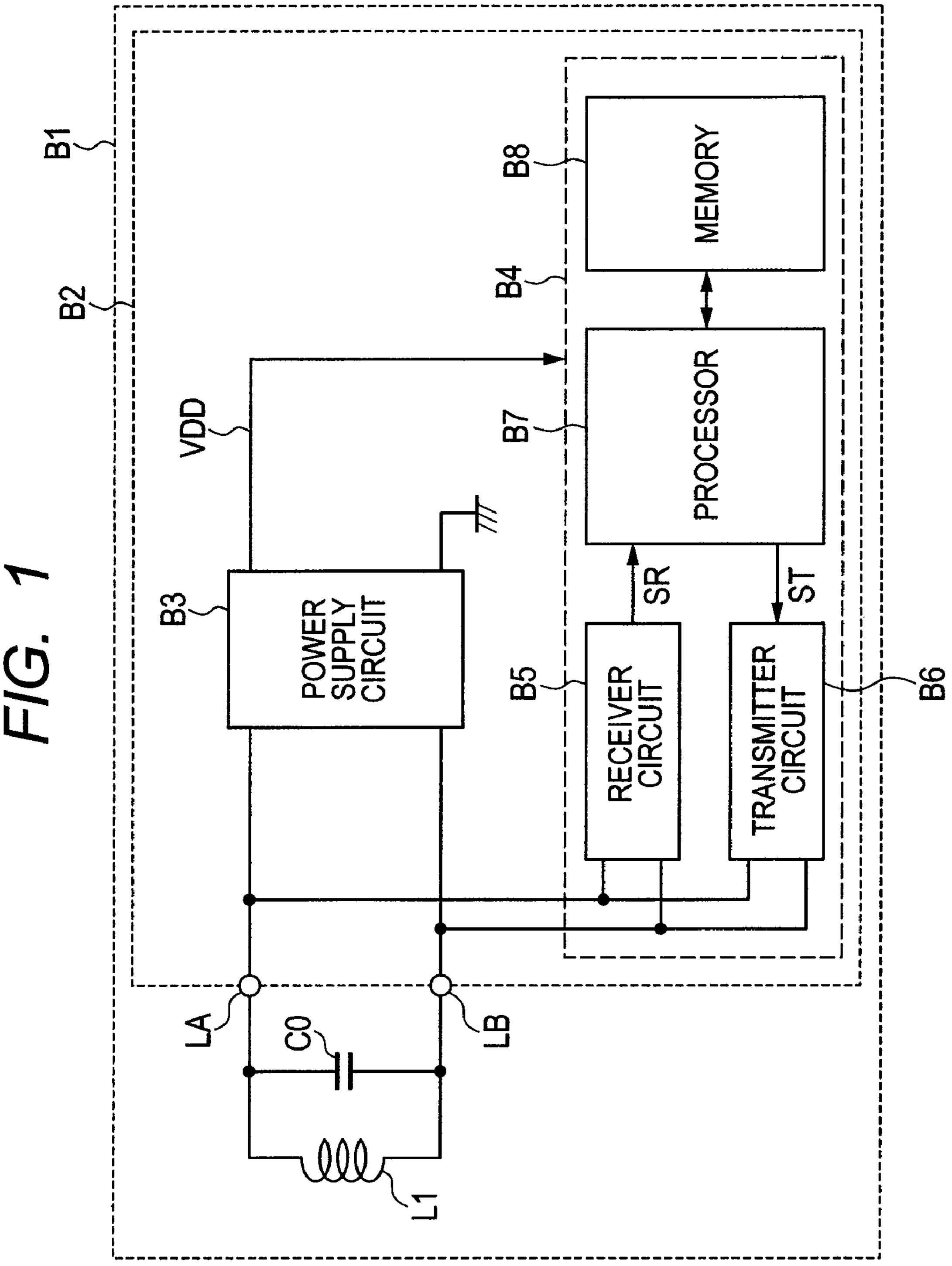
FIG. 1 is a diagram showing a basic configuration of a semiconductor integrated circuit and a contacless IC card according to a first embodiment of the present invention.

A summary of typical embodiments of the invention disclosed in the present application will first be explained. Reference numerals of the accompanying drawings referred to with parentheses in the description of the summary of the typical embodiments only illustrate elements included in the concept of components to which the reference numerals are attached.

[1] A typical embodiment of the present invention is a semiconductor integrated circuit equipped with a reception mixer (2), and a signal generator (3) which generates local signals (LO_I and LO_Q) supplied to the reception mixer.

The reception mixer is supplied with an RF received signal and the local signals to thereby generate reception mixer output signals therefrom.

The signal generator (3) has a multistage delay circuit (32), a phase detection unit (33), and a clock generation unit (34).

The multistage delay circuit (32) generates a pulse train including a plurality of clock pulse signals (tap0, tap1 and tap2 to tap8) different from each other in phase timing by a predetermined delay time (τ) in response to a carrier signal (Cr) included in the RF received signal.

The phase detection unit (33) detects differences between a voltage level ("L") of a specific clock pulse signal (tap8) generated in the pulse train generated from the multistage delay circuit, and voltage levels ("H") of the predetermined number of clock pulse signals (tap0, tap1 and tap2 to tap7) generated prior to the specific clock pulse signal to thereby detect that the specific clock pulse signal has a prescribed phase (180°) and generate a detection output signal.

The clock generation unit (34) includes a selector (341) and a first signal synthetic logic circuit (342, 343).

The selector outputs a plurality of selection clock pulse signals (tap0, tap2, tap4 and tap6) respectively having a plurality of previously-selected phases (0°, 45°, 90° and 135°) from the clock pulse signals generated from the multistage delay circuit in response to the detection output signal generated from the phase detection unit.

Figure 2:
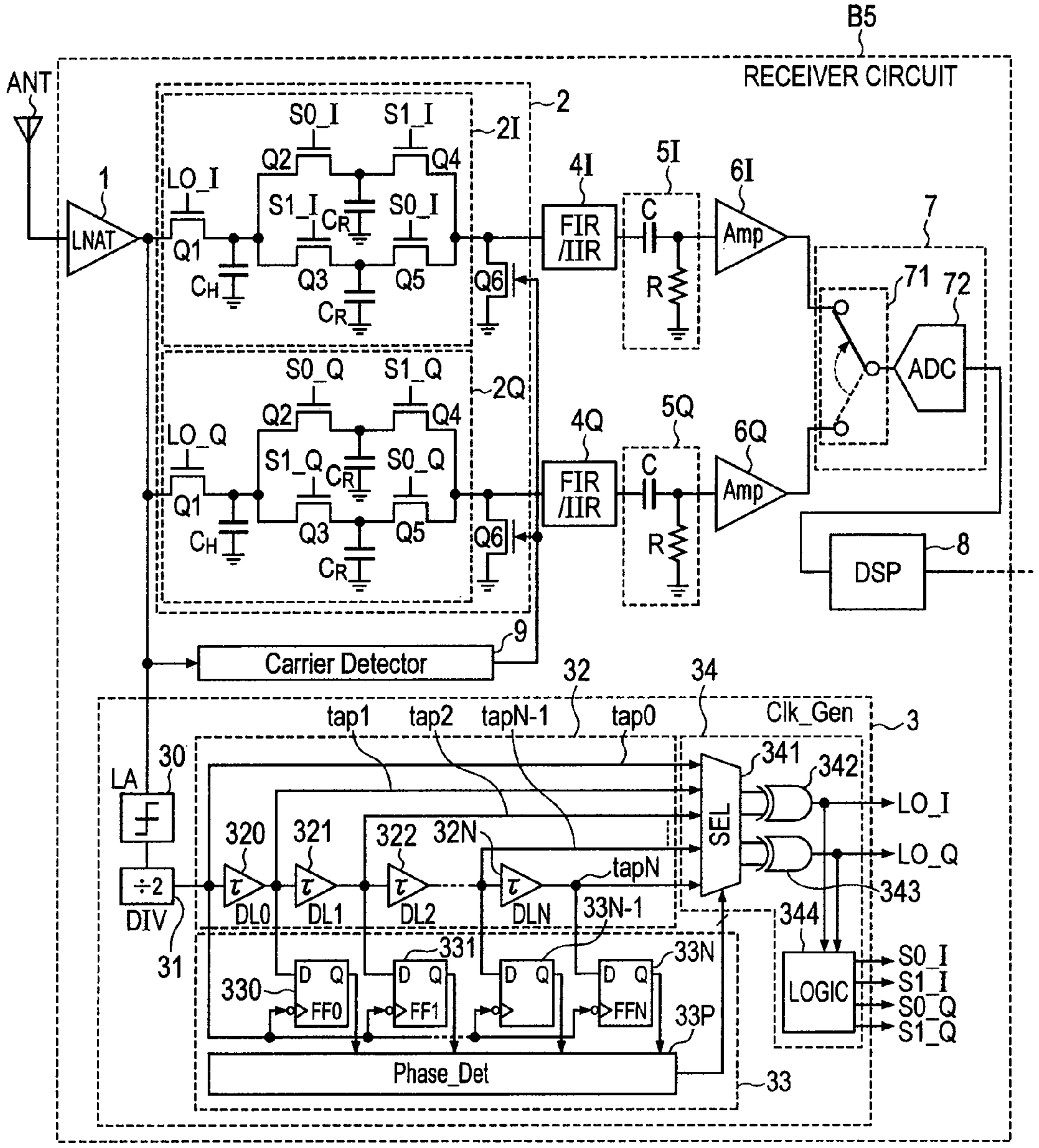
FIG. 2 is a diagram illustrating a circuit configuration of a receiver circuit B5 of the semiconductor integrated circuit B2 according to the first embodiment of the invention shown in FIG. 1.
Figure 3:
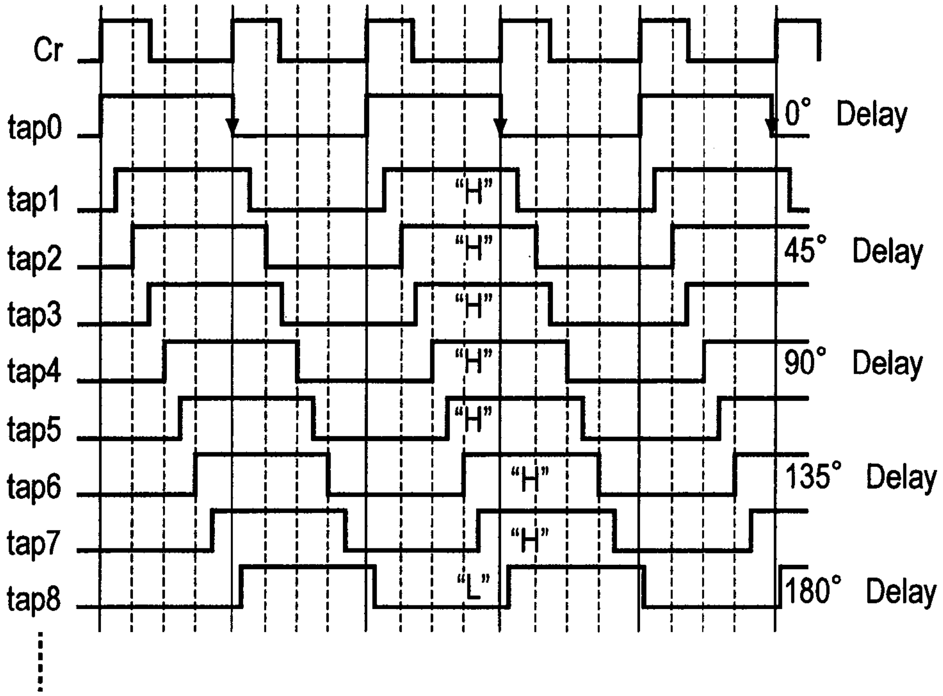
FIG. 3 is a waveform diagram showing a circuit operation of a multistage delay circuit 32 of a clock generator 3 in the receiver circuit B5 of the semiconductor integrated circuit B2 according to the first embodiment of the present invention shown in FIG. 2.
Figure 4:
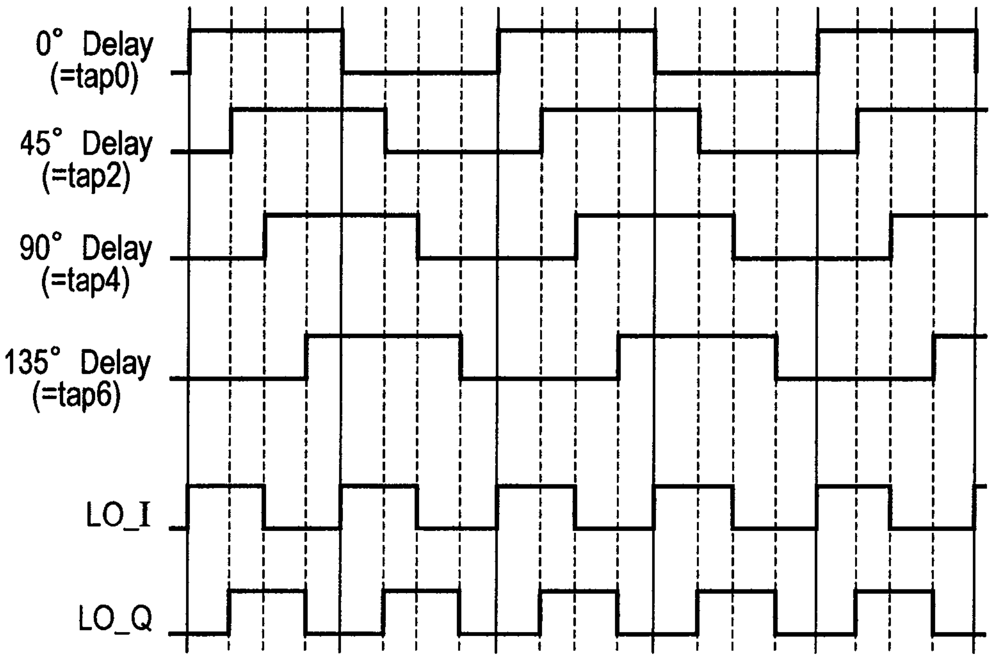
FIG. 4 is a waveform diagram showing circuit operations of two exclusive OR circuits 342 and 343 of a clock generation unit 34 of the clock generator 3 in the receiver circuit B5 of the semiconductor integrated circuit B2 according to the first embodiment of the present invention shown in FIG. 2.

The first signal synthetic logic circuit performs logical operations (EX-OR) on the selection clock pulse signals outputted from the selector to thereby generate the local signals supplied to the reception mixer (refer to FIGS. 2, 3 and 4).

According to the embodiment, it is possible to generate local signals supplied to the reception mixer without using a PLL circuit having a problem with responsivity.

In a preferred embodiment, the multistage delay circuit (32) includes a plurality of delay circuits (320, 321 and 322 to 327) coupled in series.

The phase detection unit includes a plurality of flip-flops (330, 331 and 332 to 337) and a phase detector (33P).

The delay circuits of the multistage delay circuit generate the clock pulse signals of the pulse train and supply the same to the selector and the flip-flops of the phase detection unit.

A plurality of output signals of the flip-flops are supplied to the phase detector. Thus, the phase detector generates the detection output signal and supplies the same to the selector (refer to FIG. 2).

In another preferred embodiment, a start clock pulsed signal (tap0) firstly generated in the pulse train generated from the multistage delay circuit is commonly supplied to a plurality of trigger input terminals of the flip-flops (refer to FIG. 2).

In a further preferred embodiment, the reception mixer includes a first reception mixer (2I) and a second reception mixer (2Q).

The phase detection unit (33) detects that the specific clock pulse signal has the prescribed phase that is approximately 180° and generates the detection output signal.

The selector outputs in response to the detection output signal generated from the phase detection unit, a first selection clock pulse signal (tap0) having a phase of approximately 0°, a second selection clock pulse signal (tap2) having a phase of approximately 45°, a third selection clock pulse signal (tap4) having a phase of approximately 90° and a fourth selection clock pulse signal (tap6) having a phase of approximately 135°.

A first logic circuit (342) of the first signal synthetic logic circuit performs a first logical operation (EX-OR) on the first selection clock pulse signal and, the third selection clock pulse signal to thereby generate a first RF local signal (LO_I) supplied to the first reception mixer.

A second logic circuit (343) of the first signal synthetic logic circuit performs a second logical operation (EX-OR) on the second selection clock pulse signal and the fourth selection clock pulse signal to thereby generate a second RF local signal (LO_Q) supplied to the second reception mixer.

In a more preferred embodiment, the clock generation unit (34) further includes a second signal synthetic logic circuit (344) which generates a first non-inversion digital clock signal (SO_I), a first inversion digital clock signal (SI_I), a second non-inversion digital clock signal (SO_Q) and a second inversion digital clock signal (SI_Q) in response to the first RF local signal and the second RF local signal.

The first reception mixer is configured by a first direct sampling mixer operated in response to the first RF local signal, the first non-inversion digital clock signal and the first inversion digital clock signal.

The second reception mixer is configured by a second direct sampling mixer operated in response to the second RF local signal, the second non-inversion digital clock signal and the second inversion digital clock signal (refer to FIG. 2).

A semiconductor integrated circuit according to another more preferred embodiment is further equipped with a carrier detector (9), a first reset switch transistor (Q6) and a second reset switch transistor (Q6).

The first reset switch transistor is coupled between an output terminal of the first direct sampling mixer and a ground potential. The second reset switch transistor is coupled between an output terminal of the second direct sampling mixer and the ground potential.

The carrier detector (9) detects an amplitude level of the carrier signal (Cr) contained in the RF received signal. When the amplitude level of the carrier signal is reduced to a prescribed amplitude level or less, the carrier detector controls the first reset switch transistor and the second reset switch transistor from a non-conducting state to a conducting state (refer to FIG. 2).

A semiconductor integrated circuit according to a further more preferred embodiment is further equipped with a low noise amplifier (1) coupled between an input terminal of the first direct sampling mixer and an input terminal of the second direct sampling mixer.

The low noise amplifier is configured by a low noise transconductance amplifier which converts a voltage of the RF received signal into a current. The low noise transconductance amplifier, the first direct sampling mixer and the second direct sampling mixer configure a direct conversion receiver. A first reception baseband signal is generated from the first direct sampling mixer, and a second reception baseband signal is generated from the second direct sampling mixer (refer to FIG. 2).

In another more preferred embodiment, the low noise transconductance amplifier is capable of amplifying the RF received signal based on the near field communication (NFC) technology (refer to FIG. 2).

A semiconductor integrated circuit according to a further more preferred embodiment is further equipped with a first high-pass filter (5I), a second high-pass filter (5Q), a first baseband amplifier (6I), a second baseband amplifier (6Q) and an A/D conversion unit (7).

An input terminal of the first high-pass filter and an input terminal of the second high-pass filter are respectively coupled to the output terminal of the first direct sampling mixer and the output terminal of the direct sampling mixer. An input terminal of the first baseband amplifier and an input terminal of the second baseband amplifier are respectively coupled to an output terminal of the first high-pass filter and an output terminal of the second high-pass filter. An input terminal of the A/D conversion unit is coupled to an output terminal of the first baseband amplifier and an output terminal of the second baseband amplifier.

The A/D conversion unit is configured by a nonlinear type A/D converter (72) having nonlinear input/output characteristics for meeting or adapting to fluctuations in voltage due to transient responses of the output terminal of the first high-pass filter and the output terminal of the second high-pass filter due to a fluctuation in amplitude from the small amplitude of the RF received signal based on the near field communication technology to its large amplitude.

Figure 10:
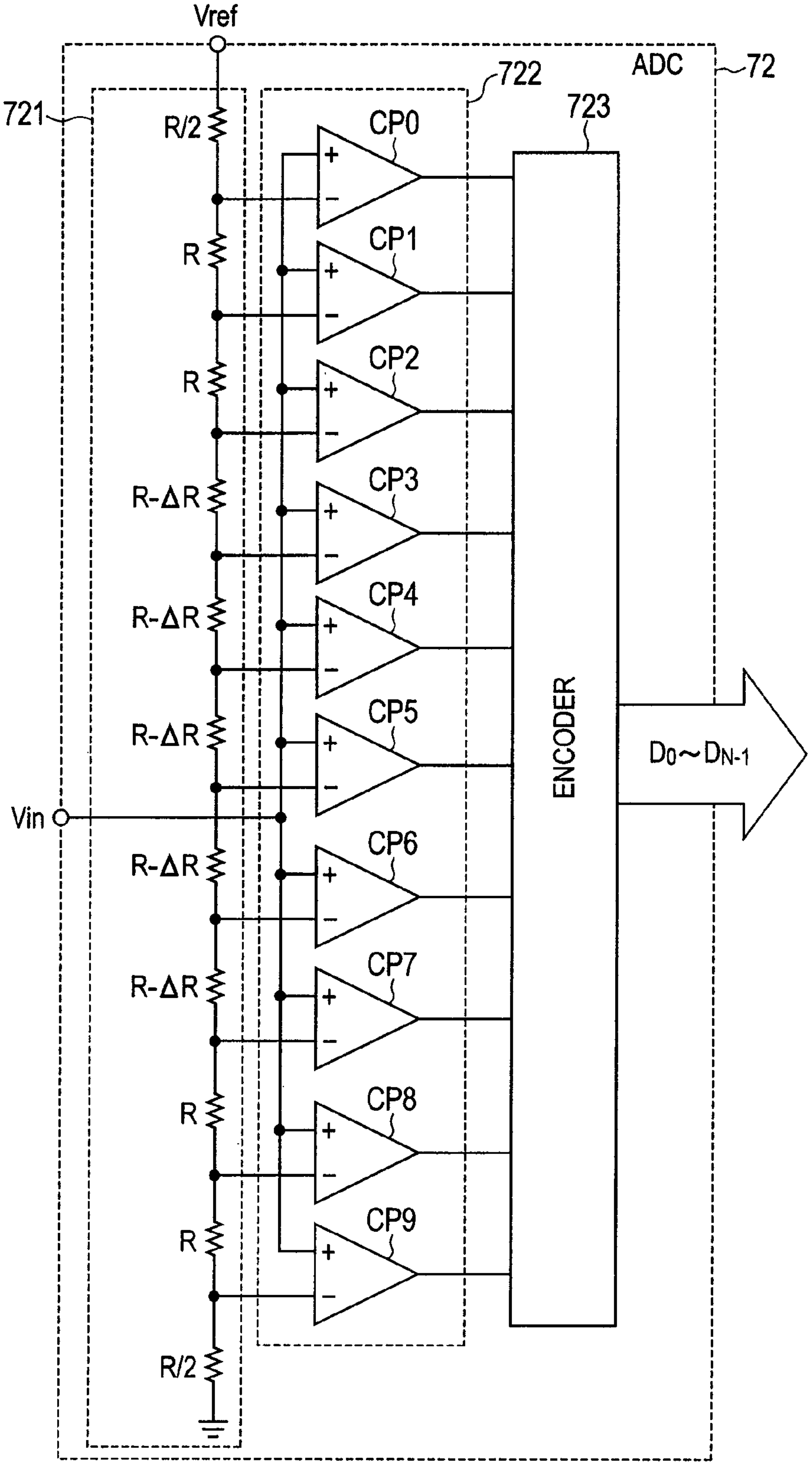
FIG. 10 is a diagram showing a configuration of a flash type nonlinear A/D converter 72 according to the first embodiment of the present invention for implementing nonlinear characteristics of an analog input voltage vs digital output signal of the A/D converter shown in FIG. 9.
Figure 11:
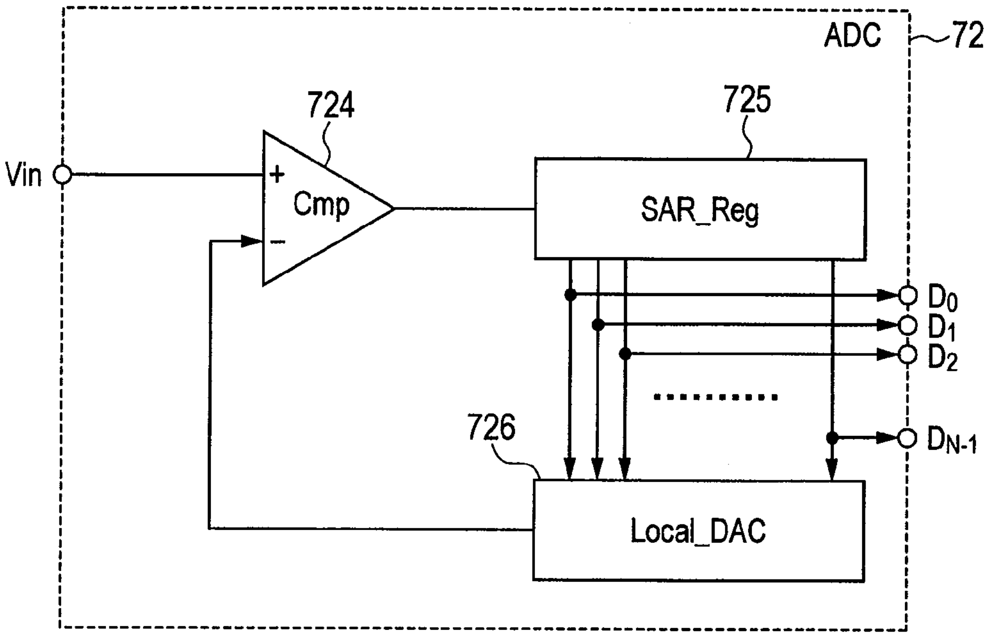
FIG. 11 is a diagram illustrating a configuration of a successive approximation type nonlinear A/D converter 72 according to a second embodiment of the present invention for implementing nonlinear characteristics of an analog input voltage vs digital output signal of an A/D converter.
Figure 13:
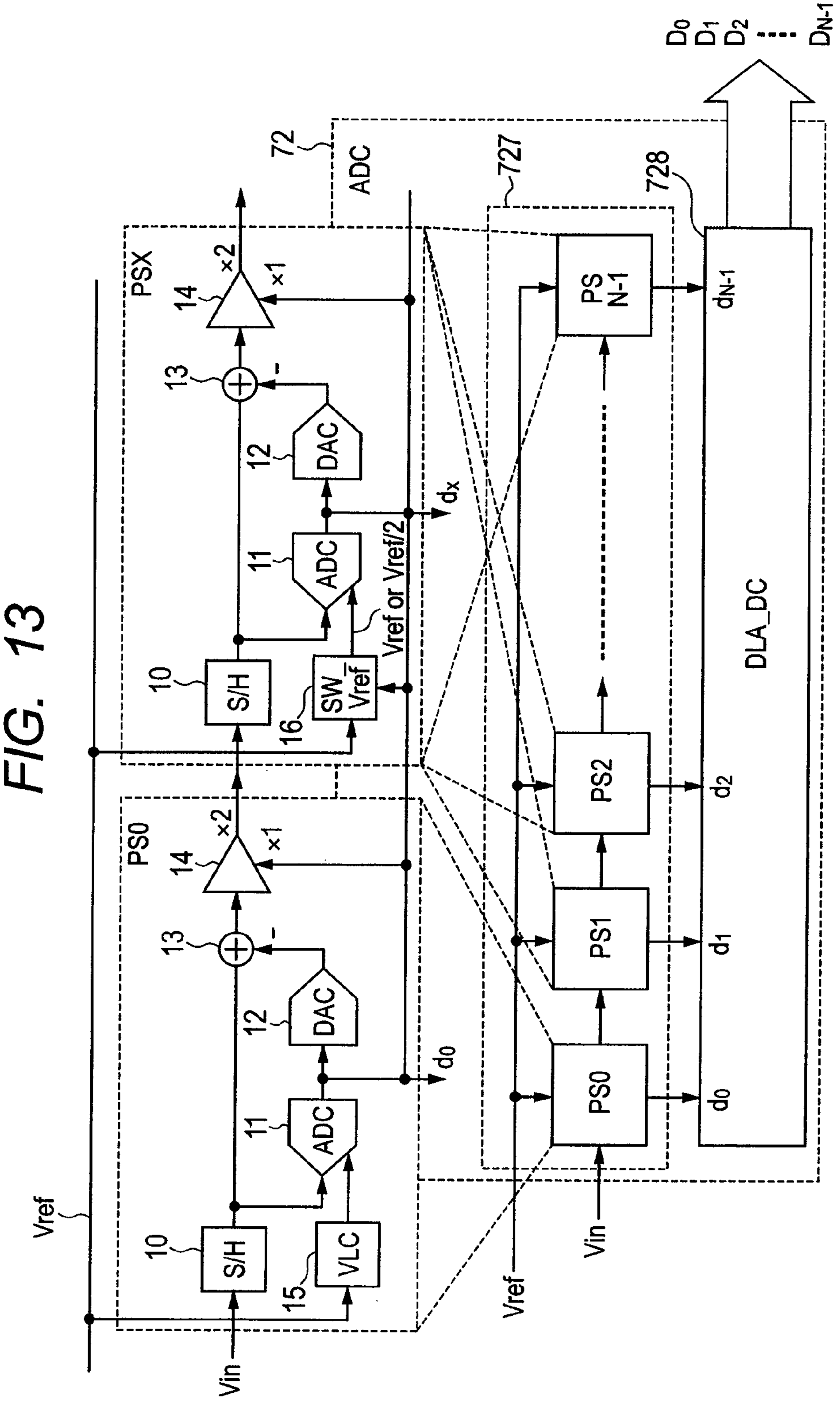
FIG. 13 is a diagram showing a configuration of a pipeline type nonlinear A/D converter 72 according to a third embodiment of the present invention for implementing nonlinear characteristics of an analog input voltage vs digital output signal of an A/D converter.

In a concrete embodiment, the nonlinear A/D converter is configured by any of a flash type nonlinear A/D converter, a successive approximation type nonlinear A/D converter and a pipeline type nonlinear A/D converter (refer to FIGS. 10, 11 and 13).

[2] A typical embodiment according to another aspect of the present invention is an operating method of a semiconductor integrated circuit equipped with a reception, mixer (2) and a signal generator (3) which generates local signals (LO_I and LO_Q) supplied to the reception mixer.

The reception mixer is supplied with an RF received signal and the local signals to thereby generate reception mixer output signals therefrom.

The signal generator (3) has a multistage delay circuit (32), a phase detection unit (33), and a clock generation unit (34).

The multistage delay circuit (32) generates a pulse train including a plurality of clock pulse signals (tap0, tap1 and tap2 to tap8) different from each other in phase timing by a predetermined delay time (τ) in response to a carrier signal (Cr) included in the RF received signal.

The phase detection unit (33) detects differences between a voltage level ("L") of a specific clock pulse signal (tap8) generated in the pulse train generated from the multistage delay circuit, and voltage levels ("H") of the predetermined number of clock pulse signals (tap0, tap1 and tap2 to tap7) generated prior to the specific clock pulse signal to thereby detect that the specific clock pulse signal has a prescribed phase (180°) and generate a detection output signal.

The clock generation unit (34) includes a selector (341) and a first signal synthetic logic circuit (342, 343).

The selector outputs a plurality of selection clock pulse signals (tap0, tap2, tap4 and tap6) respectively having a plurality of previously-selected phases (0°, 45°, 90° and 135°) from the clock pulse signals generated from the multistage delay circuit in response to the detection output signal generated from the phase detection unit.

The first signal synthetic logic circuit performs logical operations (EX-OR) on the selection clock pulse signals outputted from the selector to thereby generate the local signals supplied to the reception mixer (refer to FIGS. 2, 3 and 4).

According to the embodiment, it is possible to generate local signals supplied to the reception mixer without using a PLL circuit having a problem with responsivity.

2. Further Detailed Description of the Embodiments

Embodiments will next be explained in further detail. Incidentally, in all of the drawings for explaining the best modes for carrying out the invention, the same reference numerals are respectively attached to components having the same function as in the drawings, and their repetitive description will be omitted.

First Embodiment

Semiconductor Integrated Circuit and Contactless IC Card

FIG. 1 is a diagram showing a basic configuration of a semiconductor integrated circuit and a contactless IC card according to a first embodiment of the present invention.

As shown in FIG. 1, a contactless IC card B1 includes a loop coil antenna L1, a capacitor C0 and a semiconductor integrated circuit B2. The semiconductor integrated circuit B2 has a power supply circuit B3, an internal circuit B4 and antenna terminals LA and LB for coupling the antenna L1.

The antenna L1 having received an RF frequency of 13.56 MHz as electromagnetic waves from a reader-writer device outputs a high frequency AC signal to the antenna terminals LA and LB. Upon communication with the reader-writer device from the IC card B1, the high frequency AC signal at the antenna terminals LA and LB is modulated by a transmission information signal (data).

<<Power Supply Circuit>>

The power supply circuit B3 is made up of a rectifying circuit and a smoothing capacitor. The rectifying circuit rectifies and smoothes the AC signal received by the antenna L1 provided over the IC card to thereby obtain an output power supply voltage $V_{DD}$. A voltage regulator may be built in the power supply circuit B3 to prevent the output power supply voltage $V_{DD}$ from exceeding a predetermined voltage. The power supply voltage $V_{DD}$ outputted from the power supply circuit B3 is supplied as an operating power supply voltage for the interval circuit B4.

<<Internal Circuit>>

The internal circuit B4 is comprised of a receiver circuit B5, a transmitter circuit B6, a signal processor B7 and a memory B8.

<<Receiver Circuit>>

The receiver circuit B5 demodulates an information signal superimposed on the AC signal received by the antenna L2 built in the IC card and supplies it to the signal processor B7 as a digital reception information signal SR.

<Transmission Circuit>>

The transmission circuit B6 receives a digital transmission information signal ST outputted from the signal processor B7 and demodulates the AC signal received by the antenna L1 in accordance with the digital transmission information signal ST. Thus, the reader-writer device receives the transmission information signal from the signal processor B7 in response to a change in the reflection of the electromagnetic waves from the antenna L1 due to this modification.

<<Circuit Configuration of Receiver Circuit>>

FIG. 2 is a diagram showing a circuit configuration of the receiver circuit B5 of the semiconductor integrated circuit B2 according to the first embodiment of the present invention shown in FIG. 1.

As shown in FIG. 2, the receiver circuit B5 is comprised of a direct conversion receiver including a low-noise transconductance amplifier (LNAT) 1, a direct sampling mixer 2, a clock generator 3, a first filter 4I and a second filter 4Q, a first high-pass filter 5I and a second high-pass filter 5Q, a first baseband amplifier 6I and a second baseband amplifier 6Q, an A/D conversion unit 7, a digital signal processor $(DSP)_8$, and a carrier detector 9.

<<Low-Noise Transconductance Amplifier>>

The low-noise transconductance amplifier 1 is a low-noise amplifier comprised of a transconductance amplifier which converts an RF received voltage signal at an antenna ANT that is a loop coil antenna L1 into a current. For example, the low-noise transconductance amplifier 1 is made up of an N channel MOS transistor having a gate supplied with the RF received voltage signal, a source coupled to a ground potential, and a drain from which an RF-converted current is generated.

<<Direct Sampling Mixer>>

The direct sampling mixer 2 includes a first direct sampling mixer 2I, a second direct sampling mixer 2Q and two reset switches Q6 and Q6.

The first direct sampling mixer 2I operates as a frequency downconveter which is supplied with the RF-converted current of the low-noise transconductance amplifier 1, and a first RF local signal LO_I, a first non-inversion digital clock signal S0_I and a first inversion digital clock signal S1_I generated from the clock generator 3 to thereby generate a reception baseband signal of an in-phase component (I).

The second direct sampling mixer 2Q operates as a frequency downconverter which is supplied with the RF-converted current of the low-noise transconductance amplifier 1, and a second RF local signal LO_Q, a second non-inversion digital clock signal SO_Q and a second inversion digital clock signal S1_Q generated from the clock generator 3 to thereby generate a reception baseband signal of a quadrature component (Q).

The direct sampling mixer has been described in the following two Documents.

Document 1: Khurram Muhammand et al, "DIRECT RF SAMPLING MIXER WITH RECURSIVE FILTERINBG IN CHARGE DOMEIN", 2004 IEEE International Symposium CIRCUITS AND SYSTEMS, PP. I-577-I-580.

Document 2: Robert Bogdan Staszewski et al, "All-Digital TX Frequency Synthesizer and Discrete-Time Receiver for Bluetooth Radio in 130-nm CMOS", IEEE JOURNAL OF SOLID-STATE CIRCUITS, VOL. 39, NO. 12. DECEMBER 2004, PP. 2278-2291.

As shown in FIG. 2, the first direct sampling mixer 2I and the second direct sampling mixer 2Q of the direct sampling mixer 2 respectively include five N channel MOS transistors Q1 through Q5 and three capacitors $C_H$, $C_R$ and $C_R$. A source-to-drain path of the N channel MOS transistor Q1 is coupled between the output of the low-noise transconductance amplifier 1 and one end of the capacitor $C_H$. The other end of the capacitor $C_H$ is coupled to a ground potential. The source-to-drain path of the N channel MOS transistor Q1 is supplied with the RF-converted current from the output of the low-noise transconductance amplifier 1.

One end of the capacitor $C_H$ is coupled to one end of the capacitor $C_R$ through a source-to-drain path of the N channel MOS transistor Q2. The other end of the capacitor $C_R$ is coupled to the ground potential. On end of the capacitor $C_H$ is coupled to one end of the capacitor $C_R$ through a source-to-drain path of the N channel MOS transistor Q3. The other end of the capacitor $C_R$ is coupled to the ground potential.

One end of the capacitor $C_R$ is coupled to an output terminal of the direct sampling mixer 2 through a source-to-drain path of the N channel MOS transistor Q4. One end of the capacitor $C_R$ is coupled to an output terminal of the direct sampling mixer 2 through a source-to-drain path of the N channel MOS transistor Q5.

A gate of the N channel MOS transistor Q1 is supplied with RF local signals LO generated from the clock generator 3. A gate of the N channel MOS transistor Q2 and a gate of the N channel MOS transistor Q5 are supplied with non-inversion digital clock signals S0 generated from the clock generator 3. A gate of the N channel MOS transistor Q3 and a gate of the N channel MOS transistor Q4 are supplied with inversion digital clock signals S1 generated from the clock generator 3.

An electrical charge is shared between the capacitor $C_H$ and the capacitor $C_R$ on the upper side with a timing at which the RF local signal LO and the non-inversion digital clock signal S0 are simultaneously brought into a high level. An electrical charge is shared between the capacitor $C_H$ and the capacitor $C_R$ on the lower side with a timing at which the RF local signal LO and the inversion digital clock signal S1 are simultaneously brought into a high level. It is therefore possible to obtain the characteristic of an infinite impulse response (IIR) filter.

When the high level periods of the non-inversion digital clock signal S0 and the inversion digital clock signal S1 are set to N times the period of the RF local signal LO, they are averaged with N samples. It is therefore possible to obtain the characteristic of a finite impulse response (FIR) filter having a dimension ratio N.

A first filter 4I and a second filter 4Q coupled to their corresponding output terminals of both the first direct sampling mixer 2I of the direct sampling mixer 2 shown in FIG. 2 and the second direct sampling mixer 2Q thereof typically show the above characteristic of the finite impulse response filter and the above characteristic of the infinite impulse response filter respectively.

As the reception mixer of the RF reception unit as described even in the Non-Patent Document 1, the double balance type cross-coupled quad mixer also called Gilbert type mixer has heretofore been used traditionally. Since, however, this type of reception mixer adopts an analog circuit configuration in which a load resistor, two differential pair transistors and a constant current source are coupled in series between the power supply voltage and the ground potential, the reception mixer is accompanied by problems that its operation at a low power supply voltage is difficult and power consumption is also large.

On the other hand, since the direct sampling mixer 2 shown in FIG. 2 adopts a digital RF architecture, the operation at the low power supply voltage is enabled and a reduction in power consumption is also enabled. Further, since a miniaturized CMOS semiconductor manufacturing process can be applied to the digital RF architecture, a further reduction in power consumption is also enabled by the miniaturized CMOS.

<<Clock Generator>>

The clock generator 3 uses the multistage delay circuit 32 in particular in the first embodiment of the present invention without being configured by a general PLL circuit.

As shown in FIG. 2, the clock generator 3 includes a limiter amplifier 30, a divider 31, a multistage delay circuit 32, a phase detection unit 33 and a clock generation unit 34.

An RF amplified signal generated from the output terminal of the low-noise transconductance amplifier 1 is supplied to an input terminal of the limiter amplifier 30. Consequently, the limiter amplifier 30 amplifies the RF amplified signal with a large amplification factor and performs the operation of amplitude-limiting the RF amplified output signal generated from the output terminal of the limiter amplifier 30 to a predetermined maximum limit value and a predetermined minimum limit value respectively.

In consideration of a possibility that the inconsistency (inconsistency of duty) of a high level period and a low level period exist in the RF amplified output signal of the limiter amplifier 30, the divider 31 performs a ½ division. For example, the divider 31 changes an output signal level from a low level to a high level or vice versa in response to only a change in the waveform from a low level of the RF amplified output signal of the limiter amplifier 30 to a high level thereof and performs a ½ division.

The multistage delay circuit 32 is comprised of a plurality of series-coupled delay circuits 320, 321 and 322 through 32N. The delay circuits 320, 321 and 322 through 32N have approximately the same propagation delay time $\tau$.

An input terminal tap0 of the first-stage delay circuit 320 driven by the output signal of the divider 31 is coupled to a first input terminal of a selector 341 of the clock generation unit 34. An input terminal tap1 of the second-stage delay circuit 321 driven by an output signal of the first-stage delay circuit 320 is coupled to a second input terminal of the selector 341 of the clock generation unit 34. An input terminal tap2 of the third-stage delay circuit 322 driven by an output signal of the second-stage delay circuit 321 is coupled to a third input terminal of the selector 341 of the clock generation unit 34. Subsequently, in the same manner as above, an input terminal tapN−1 of the Nth-stage delay circuit 32N driven by an output signal of the N−1th-stage delay circuit is coupled to an Nth input terminal of the selector 341 of the clock generation unit 34. An output terminal tapN of the Nth-stage delay circuit 32N is coupled to an N+1th input terminal of the selector 341 of the clock generation unit 34.

The phase detection unit 33 is made up of a plurality of flip-flops 330, 331 and 332 through 33N, and a phase detector 33P. Trigger input terminals of the flip-flops 330, 331 and 332 through 33N expressed in round symbols and triangle symbols are commonly coupled to the input terminal tap0 of the first-stage delay circuit 320 supplied with the division output signal from the divider 31. A data input terminal D and a data output terminal Q of the first flip-flop 330 are coupled to the input terminal tap1 of the second-stage delay circuit 321 and a first input terminal of the phase detector 33P. A data input terminal D and a data output terminal Q of the second flip-flop 331 are coupled to the input terminal tap2 of the three-stage delay circuit 322 and a second input terminal of the phase detector 33P. Subsequently, in the same manner as above, a data input terminal D and a data output terminal Q of the N−1th flip flop 33N−1 are coupled to an input terminal tapN−1 of the N+1th-stage delay circuit 32N and an Nth input terminal of the phase detector 33P. Finally, a data input terminal D and a data output terminal Q of the Nth flip-flop 33N are coupled to an output terminal tapN of the N+1th-stage delay circuit 32N and an N+1th input terminal of the phase detector 33P.

The clock generation unit 34 is comprised of a selector 341, two explosive-OR (EX-OR) circuits 342 and 343 and a logic circuit 344. A first input terminal, a second input terminal, a third input terminal, an Nth terminal and an N+1th input terminal of the selector 341 are respectively coupled to the input terminal tap0 of the first-stage delay circuit 320, the input terminal tap1 of the second-stage delay circuit 321, the input terminal tap2 of the third-stage delay circuit 322, the input terminal tapN−1 of the Nth-stage delay circuit 32N and the output terminal tapN of the Nth-stage delay circuit 32N in the multistage delay circuit 32. Further, a control input terminal of the selector 341 is supplied with a phase-detected output signal generated from the phase detector 33P.

In response to the phase-detected output signal supplied from the phase detector 33P, the selector 341 selects input signals that are four in total corresponding to an input signal having a phase of 0°, an input signal having a phase of 45°, an input signal having a phase of 90°, and an input signal having a phase of 135° from N+1 input signals in total at the first input terminal, the second input terminal, the third input terminal, the N terminal and the N+1th input terminal and supplies them to input terminals of the two explosive-OR (EX-OR) circuits 342 and 343. That is, the two input terminals of the explosive-OR circuit 342 are supplied with the input signal having the phase of 0°, and the input signal having the phase of 90°. The two input terminals of the exclusive-OR circuit 343 are supplied with the input signal having the phase of 45° and the input signal having the phase of 135°. As a result, a first RF local signal LO_I is generated from an output terminal of the exclusive-OR circuit 342. A second RF local signal LO_Q is generated from an output terminal of the exclusive-OR circuit 343. Finally, the logic circuit 344 is supplied with the first RF local signal LO_I and the second RF local signal LO_Q so that a first non-inversion digital clock signal S0_I, a first inversion digital clock signal SI_I, a second non-inversion digital clock signal S0_Q, and a second inversion digital clock signal S1_Q are generated from their corresponding output terminals of the logic circuit 344.

FIG. 3 is a waveform diagram showing a circuit operation of the multistage delay circuit 32 of the clock generator 3 of the receiver circuit B5 in the semiconductor integrated circuit B2 according to the first embodiment of the present invention shown in FIG. 2.

The waveform of a carrier signal Cr having an RF frequency of 13.56 MHz received by the antenna ANT of the loop coil antenna L1 is first shown in FIG. 3. The waveform of the carrier signal Cr actually shown in FIG. 3 is however an RF amplified output signal amplitude-limited by the limiter amplifier 30.

Further, a signal waveform at the input terminal tap0 of the first-stage delay circuit 320 of the multistage delay circuit 32, a signal waveform at the input terminal tap1 of the second-stage delay circuit 321, a signal waveform at the input terminal tap2 of the third-stage delay circuit 322, a signal waveform at an input terminal tap3 of a fourth-stage delay circuit 323 (not shown), a signal waveform at an input terminal tap4 of a fifth-stage delay circuit 324 (not shown), a signal waveform at an input terminal tap5 of a sixth-stage delay circuit 325 (not shown), a signal waveform at an input terminal tap6 of a seventh-stage delay circuit 326 (not shown), a signal waveform at an input terminal tap7 of an eighth-stage delay circuit 327 (not shown) and a signal waveform at an input terminal tap8 of a ninth-stage delay circuit 328 (not shown) are shown in FIG. 3.

As shown in FIG. 3, the divider 31 changes an output signal level from a low level to a high level or vice versa in response to only a change in the waveform of the carrier signal Cr having the RF frequency in the RF amplified output signal of the limiter amplifier 30 from a low level to a high level. Therefore, the signal at the input terminal tap0 of the first-stage delay circuit 320 driven by the output signal of the divider 31 becomes a signal obtained by ½-dividing the carrier signal Cr of the RF frequency.

Since the delay circuits 320, 321 and 322 through 32N of the multistage delay circuit 32 have substantially the same propagation time τ, the signal waveform at the input terminal tap1 of the second-stage delay circuit 321 changes with being delayed by the propagation time τ than a change in the signal waveform at the input terminal tap0 of the first-stage delay circuit 320. Subsequently, in the same manner as above, the signal waveform at the input terminal tap8 of the ninth-stage delay circuit 328 (not shown) changes with being delayed by the propagation time τ than a change in the signal waveform at the input terminal tap7 of the eighth-stage delay circuit 327 (not shown).

In the example illustrated in FIG. 3, the signal waveform at the input terminal tap0 of the first-stage delay circuit 320 changes from a high level to a low level with the timing at which the carrier signal Cr of the RF frequency changes from the low level to the high level. And also the signal waveform at the input terminal tap1 is high "H" in level, the signal waveform at the input terminal tap2 is high "H" in level, the signal waveform at the input terminal tap3 is high "H" in level, the signal waveform at the input terminal tap4 is high "H" in level, the signal waveform at the input terminal tap5 is high "H" in level, the signal waveform at the input terminal tap6 is high "H" in level, and the signal waveform at the input terminal tap7 is high "H" in level. Thus, the signal at the input terminal tap0 is brought to a low level "L" starting from the signal waveform at the next imputer terminal tap8.

That is, at this timing, the high level "H", high level "H", high level "H", high level "H", high level "H", high level "H", high level "H", and low level "L" respectively supplied to the data input terminals D of the flip-flops 330, 331, 332, 333, 334, 335, 336 and 337 are latched in the flip-flops 330, 331 and 332 through 337 with the high-to-low change of the signal waveform at the input terminal tap0 supplied to the trigger input terminals of the flip-flops 330, 331 and 332 through 337 as a trigger. As a result, data indicative of the high level "H", high level "H", high level "H", high level "H", high level "H", high level "H", high level "H", and low level "L" are generated from their corresponding data output terminals D of the flip-flips 330, 331, 332, 333, 334, 335, 336, 337 and 338 at this timing.

That is, at the timing provided to change the carrier signal Cr of the RF frequency from the low level to the high level, the signal waveform at the input terminal tap0 changes from the high level to the low level, whereas the signal waveform at the input terminal tap8 is in a state immediately before it changes from the low level to the high level. Thus, in the example of FIG. 3, the phase of the signal waveform at the input terminal tap8 is delayed by approximately 180° (π) as compared with the phase of the signal waveform at the input terminal tap0.

Thus, the occurrence of the phase delay of 180° (π) can be determined by detecting a 8-bit data output signal "HHHHHHHL" of the flip-flops 330, 331, 332, 333, 334, 335, 336 and 337 supplied to the phase detector 33P by the phase detector 33P at this timing. When the occurrence of the phase delay of 180° (π) between the signal waveforms at the input terminals tap0 and tap8 is detected by the phase detector 33P, the phase-detected output signal outputted from the phase detector 33P is supplied to the control input terminal of the selector 341.

The selector 341 selects the input signal of the phase 0° at the input terminal tap0 and the input signal of the phase 90° at the input terminal tap4 in response to the phase-detected output signal supplied from the phase detector 33P and supplies the same to the two input terminals of the exclusive-OR circuit 342. The selector 341 selects the input signal of the phase 45° at the input terminal tap2 and the input signal of the phase 135° at the input terminal tap6 and supplies the same to the two input terminals of the exclusive-OR circuit 343.

FIG. 4 is a waveform diagram showing circuit operations of the two exclusive-OR circuits 342 and 343 of the clock generation unit 34 of the clock generator 3 in the receiver circuit B5 of the semiconductor integrated circuit B2 according to the first embodiment of the present invention shown in FIG. 2.

As shown in FIG. 4, the exclusive-OR circuit 342 performs an exclusive-OR (EX-OR) operation on the input signal of the phase 0° at the input terminal tap0 and the input signal of the phase 90° at the input terminal tap4 to thereby generate a first RF local signal LO_I. On the other hand, the exclusive-OR circuit 343 performs an exclusive-OR (EX-OR) operation on the input signal of the phase 45° at the input terminal tap2 and the input signal of the phase 135° at the input terminal tap6 to thereby generate a second RF local signal LO_Q.

Further, the logic circuit 344 of the clock generation unit 34 shown in FIG. 3 is supplied with the first RF local signal LO_I and the second RF local signal LO_Q to thereby generate a first non-inversion digital clock signal S0_I, a first inversion digital clock signal S1_I, a second non-inversion digital clock signal S0_Q and a second inversion digital clock signal S1_Q each having a frequency lower than the frequency of each RF local signal from their corresponding output terminals of the logic circuit 344.

Thus, the first RF local signal LO_I, second RF local signal LO_Q, first non-inversion digital clock signal S0_I, first inversion digital clock signal S1_I, a second non-inversion digital clock signal S0_Q and second inversion digital clock signal S1_Q generated from the clock generation unit 34 of the clock generator 3 are supplied to the first direct sampling mixer 2I and the second direct sampling mixer 2Q of the direct sampling mixer 2. As a result, the direct sampling mixer 2 generates a reception baseband signal of an in-phase component (I) from the output of the first direct sampling mixer 2I and generates a reception baseband signal of a quadrature component (Q) from the output of the second direct sampling mixer 2Q.

As a result, according to the clock generator 3 of the first embodiment of the present invention described using FIGS. 1 through 4, the value of amplitude of the carrier signal Cr of the RF frequency corresponding to 13.56 MHz received by the antenna ANT of the loop coil antenna L1 is restored from zero to a predetermined value. Thereafter, the first RF local signal LO_I, second RF local signal LO_Q, first non-inversion digital clock signal S0_I, first inversion digital clock signal S1_I, second non-inversion digital clock signal S0_Q and second inversion digital clock signal S1_Q synchronized with the phase and frequency of the carrier signal Cr of the RF frequency can be generated early and supplied to the first direct sampling mixer 2I and the second direct sampling mixer 2Q of the direct sampling mixer 2 early.

Thus, according to the clock generator 3 of the first embodiment of the present invention described using FIGS. 1 through 4, it is possible to solve the problem that when the local signals supplied to the reception mixer of the direct conversion receiver are generated from the PLL circuit, a recovery time taken from the recovery of the amplitude value of the carrier signal of the RF frequency corresponding to 13.56 MHz used in the NFC technology to the predetermined value after the amplitude value becomes zero and the PLL circuit is brought to an unlocked state, to the time when the PLL circuit is brought to a locked state again, is long.

<<Carrier Detector>>

The carrier detector 9 detects that the amplitude value of the carrier signal of the RF frequency corresponding to 13.56 MHz used in the NFC technology becomes approximately zero by a modulation depth of 100%.

On the other hand, when the amplitude value of the carrier signal of the RF frequency becomes approximately zero, the operation of the clock generator 3 is stopped. For this reason, the RF local signals LO_I and LO_Q and digital clock signals S0_I, S1_I, SO_Q and S1_Q are not generated from the clock generator 3 during this operation stop period. Thus, the operations of the first direct sampling mixer 2I and the second direct sampling mixer 2Q of the direct sampling mixer 2 are also stopped.

When the carrier detector 9 and the two reset switches Q6 and Q6 in the first embodiment of the present invention are not disposed in the receiver circuit B5, a capacitive charge at the output terminal of the first direct sampling mixer 2I and a capacitive charge at the output terminal of the second direct sampling mixer 2Q are maintained without being discharged, even though the amplitude value of the carrier signal of the RF frequency becomes approximately zero and the operations of the first direct sampling mixer 2I and the second direct sampling mixer 2Q of the direct sampling mixer 2 are stopped. Thus, since the output voltage of the output terminal of the first direct sampling mixer 2I and the output voltage of the output terminal of the second direct sampling mixer 2Q are not reduced, the ASK-demodulated output does not show an accurate envelope. It is therefore not possible to perform an accurate data communication between a contactless IC card and a reader-writer device.

On the other hand, according to the first embodiment of the present invention, the carrier detector 9 and the two reset switches Q6 and Q6 are disposed in the receiver circuit B5 in particular. Therefore, when the amplitude value of the carrier signal of the RF frequency becomes approximately zero, the carrier detector 9 detects that the amplitude value of the carrier signal of the RF frequency corresponding to 13.56 MHz used in the NFC technology becomes approximately zero not greater than the predetermined value by the modulation depth of 100%. Thus, in this case, the N channel MOS transistors of the two reset switches Q6 and Q6 are respectively controlled to an on state by the high-level detected output of the carrier detector 9. For this reason, the capacitive charge of the output terminal of the first direct sampling mixer 2I, and the capacitive charge of the output terminal of the second direct sampling mixer 2Q are discharged to the ground potential. It is therefore possible to perform an accurate data communication between the contactless IC card and the reader-writer device.

<<Multistage Delay Circuit>>

Figure 5:
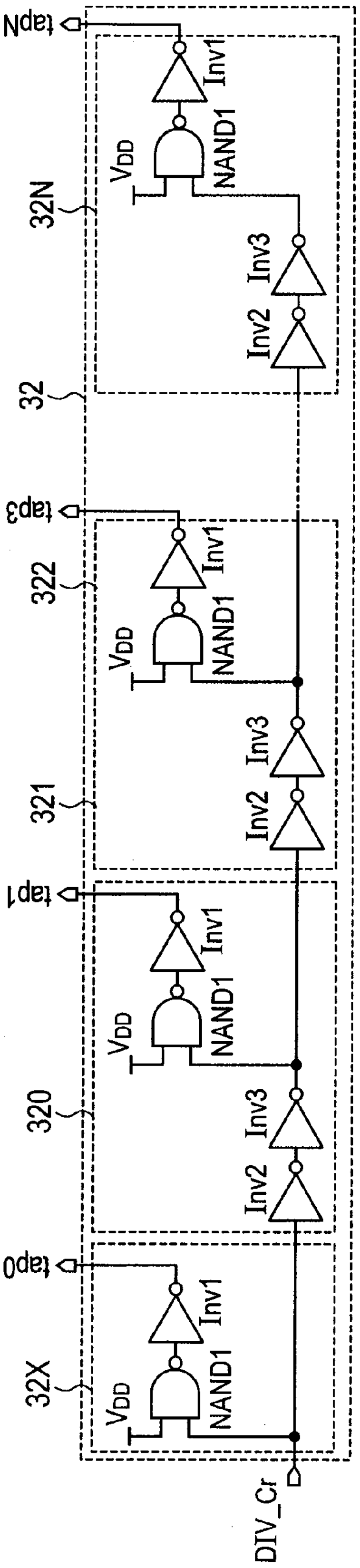
FIG. 5 is a diagram showing a configuration of a concrete circuit of the multistage delay circuit 32 of the clock generator 3 according to the first embodiment of the present invention shown in FIG. 2.

FIG. 5 is a diagram showing a configuration of a concrete circuit of the multistage delay circuit 32 of the clock generator 3 according to the first embodiment of the present invention shown in FIG. 2.

As shown in FIG. 5, a first-stage buffer circuit 32X includes a NAND circuit NAND1 and an inverter Inv1. One input terminal of the NAND circuit NAND1 and the other input terminal thereof are respectively supplied with a power supply voltage $V_{DD}$ and an output signal DIV-Cr of the divider 31. An input terminal of the inverter Inv1 is supplied with an output signal of the NAND circuit NAND1, so that a signal waveform tap0 having a phase of 0° is generated from an output terminal of the inverter Inv1 used as an output terminal of the first-stage buffer circuit 32X.

The first-stage delay circuit 320 includes two inverters Inv2 and Inv3 coupled in series to generate a predetermined propagation delay time τ, a NAND circuit NAND1, and an inverter Inv1. An input terminal of the inverter Inv2 is supplied with the output signal DIV-Cr of the divider 31. An output signal of the inverter Inv2 is supplied to an input terminal of the inverter Inv3. One input terminal of the NAND circuit NAND1 and the other input terminal thereof are respectively supplied with the power supply voltage $V_{DD}$ and an output signal of the inverter Inv3. An input terminal of the inverter Inv1 is supplied with an output signal of the NAND circuit NAND1, whereby a signal waveform tap1 having a phase of 22.5° is generated from an output terminal of the inverter Inv1 used as an output terminal of the first-stage delay circuit 320.

A second-stage delay circuit 321 is also comprised of the same circuit configuration as the first-stage delay circuit 320. A signal waveform tap2 having a phase of 45° is generated from an output terminal of an inverter Inv1, which is used as an output terminal of the second-stage delay circuit 321.

Subsequently, in the same manner as above, an Nth-stage delay circuit 32N is also comprised of the same circuit configuration as the first-stage delay circuit 320. A signal waveform tapN having a predetermined phase value is generated from an output terminal of an inverter Inv1, which is used as an output terminal of the Nth-stage delay circuit 32N.

Figure 6:
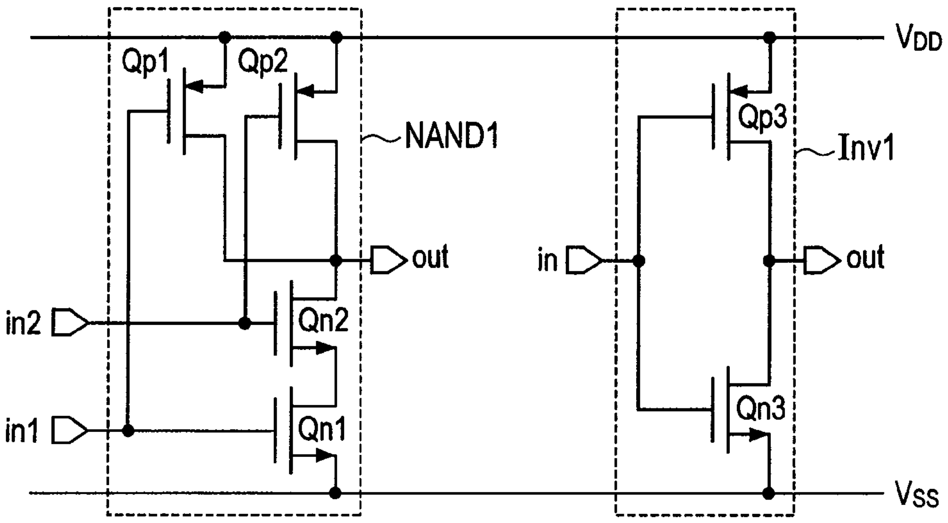
FIG. 6 is a diagram showing a configuration of a concrete circuit illustrative of a NAND circuit NAND1 and an inverter Inv1 included in the multistage delay circuit 32 of the clock generator 3 according to the first embodiment of the present invention shown in FIG. 5.

FIG. 6 is a diagram showing a configuration of a concrete circuit illustrative of the NAND circuit NAND1 and the inverter Inv1 included in the multistage delay circuit 32 of the clock generator 3 according to the first embodiment of the present invention, which are shown in FIG. 5.

As shown in FIG. 6, the NAND circuit NAND1 includes two N channel MOS transistor Qn1 and Qn2 whose source-to-drain current paths are coupled in series between a ground potential $V_{SS}$ and an output terminal out, and two P channel MOS transistor Qp1 and Qp2 whose source-to-drain current paths are coupled in parallel between a power supply voltage $V_{DD}$ and the output terminal out. A first input terminal in1 is coupled to a gate electrode of the N channel MOS transistor Qn1 and a gate electrode of the P channel MOS transistor Qp1. A second input terminal in2 is coupled to a gate electrode of the N channel MOS transistor Qn2 and a gate electrode of the P channel MOS transistor Qp2. The inverter Inv1 includes an N channel MOS transistor Qn3 of which the source-to-drain current path is coupled between the ground potential $V_{SS}$ and the output terminal out, and a P channel MOS transistor Qp3 of which the source-to-drain current path is coupled between the power supply voltage $V_{DD}$ and the output terminal out. An input terminal in is coupled to a gate electrode of the N channel MOS transistor Qn3 and a gate electrode of the P channel MOS transistor Qp3. Other inverters Inv2 and Inv3 are also made up of transistors Qn3 and Qp3 exactly in the same manner as the inverter Inv1.

Figure 7:
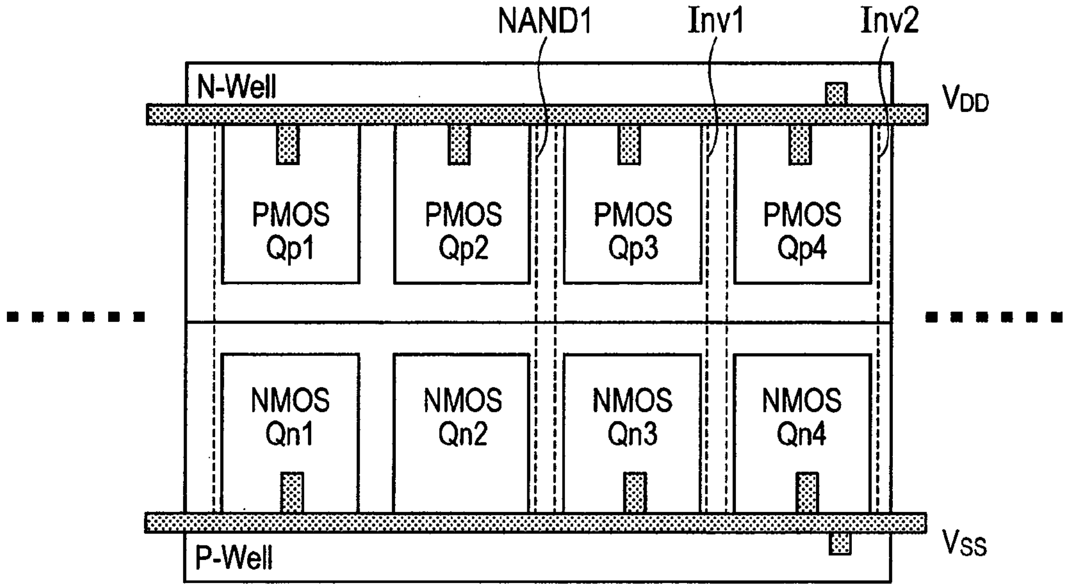
FIG. 7 is a diagram depicting a part device layout of a concrete semiconductor integrated circuit for the NAND circuit NAND1 and the inverter Inv1 included in the multistage delay circuit 32 according to the first embodiment of the present invention shown in FIG. 6.

FIG. 7 is a diagram showing a part device layout of a concrete semiconductor integrated circuit for the NAND circuit NAND1 and the inverter Inv1 included in the multistage delay circuit 32 according to the first embodiment of the present invention shown in FIG. 6.

As shown in FIG. 7, power supply/ground wirings for the power supply voltage $V_{DD}$ and the ground potential $V_{SS}$ are formed in the lateral direction as viewed in the drawing. An N-type well region N-Well is formed along the power supply wiring for the power supply voltage $V_{DD}$. A P-type well region P-Well is formed along the ground wiring for the ground potential $V_{SS}$. The N-type well region N-Well is supplied with the power supply voltage $V_{DD}$. The P-type well region P-Well is supplied with the ground potential $V_{SS}$.

Further, two P channel MOS transistors Qp1 and Qp2 that configure the NAND circuit NAND1, and two P channel MOS transistors Qp3 and Qp4 that configure the inverters Inv1 and Inv2 are formed inside the N-type well region N-Well along the power supply wiring for the power supply voltage $V_{DD}$. Two N channel MOS transistors Qn1 and Qn2 that configure the NAND circuit NAND1, and two N channel MOS transistors Qn3 and Qn4 that configure the inverters Inv1 and Inv2 are formed inside the P-type well region P-Well along the ground wiring for the ground potential $V_{SS}$. Although not shown in FIG. 7, all P channel MOS transistors and all N channel MOS transistors in CMOS logic circuits that configure the whole Nth-stage delay circuit 32N are respectively formed inside an N-type well region N-Well and a P-type well region P-Well both provided between a power supply wiring for the power supply voltage $V_{DD}$ and a ground wiring for the ground potential $V_{SS}$, both of which are disposed approximately in parallel, subsequently in the same manner as the first-stage buffer circuit 32X, the first-stage delay circuit 320 and the second-stage delay circuit 321 of the multistage delay circuit 32 in the clock generator 3 shown in FIG. 5.

<<Bypass Filter>>

In the direct sampling mixer 2 as shown in FIG. 2, the reception baseband signal of the in-phase component (I) and the reception baseband signal of the quadrature component (Q) respectively generated from the output of the first direct sampling mixer 2I and the output of the second direct sampling mixer 2Q are respectively supplied to an input terminal of the first high-pass filter 5I and an input terminal of the second high-pass filter 5Q through the first filter 41 and the second filter 4Q.

Further, an output terminal of the first high-pass filter 5I and an output terminal of the second high-pass filter 5Q are respectively coupled to an input terminal of the first baseband amplifier 6I and an input terminal of the second baseband amplifier 6Q. DC bias voltage levels at the input terminals of the first baseband amplifier 6I and the second baseband amplifier 6Q do not often coincide with DC voltage levels at the output terminals of the first direct sampling mixer 2I and the second direct sampling mixer 2Q and the output terminals of the first filter 41 and the second filter 4Q. Thus, in order to accommodate the difference in voltage between the DC bias voltage level and the DC voltage level, the first high-pass filter 5I and the second high-pass filter 5Q are respectively coupled between the output terminals of the first filter 41 and the second filter 4Q and the input terminals of the first baseband amplifier 6I and the second baseband amplifier 6Q.

Each of the first high-pass filter 5I and the second high-pass filter 5Q is basically comprised of a capacitor C having one end coupled to the output terminals of the first filter 41 and the second filter 4Q and the other end coupled to the input terminals of the first baseband amplifier 6I and the second baseband amplifier 6Q, and a resistor R having one end coupled to the other end of the capacitor C and the other end coupled to the ground potential. Each of concrete first and second high-pass filters 5I and 5Q is comprised of a capacitor C, a resistor R and an operational amplifier. A reception baseband signal is supplied to an inversion input terminal of the operational amplifier via the capacitor C. The resistor R is coupled between the inversion input terminal of the operational amplifier and an output terminal. A reference voltage is supplied to a non-inversion input terminal of the operational amplifier.

<<Baseband Amplifier>>

As shown in FIG. 2, the reception baseband signal of the in-phase component (I) and the reception baseband signal of the quadrature component (Q) respectively generated from the output terminal of the first high-pass filter 5I and the output terminal of the second high-pass filter 5Q are respectively amplified by the first baseband amplifier 6I and the second baseband amplifier 6Q. Each of the first baseband amplifier 6I and the second baseband amplifier 6Q is comprised of a multistage amplifier circuit of two stages coupled in series.

<<A/D Conversion Unit and DSP>>

As shown in FIG. 2, the A/D conversion unit 7 includes a selector switch 71 having one input terminal, the other input terminal and an output terminal, and an A/D converter 72. One input terminal of the selector switch 71 and the other input terminal thereof are respectively supplied with the reception baseband signal of the in-phase component (I) at the output terminal of the first high-pass filter 5I and the reception baseband signal of the quadrature component (Q) at the output terminal of the second high-pass filter 5Q. Thus, the reception baseband signal selected from both reception baseband signals can be generated at the output terminal of the selector switch 71. The selected reception baseband signal generated at the output terminal of the selector switch 71 is supplied to an analog input terminal of the A/D converter 72. A reception digital baseband signal generated from a digital output terminal of the A/D converter 72 is supplied to an input terminal of the digital signal processor (DSP) 8.

Since the reception baseband signal of the in-phase component (I) and the reception baseband signal of the quadrature component (Q) alternately selected by the selector switch 71 are alternately A/D converted, the digital signal processor 8 is alternately supplied with the reception digital baseband signal of the in-phase component (I) and the reception digital baseband signal of the quadrature component (Q). The digital signal processor 8 selects the signal large in signal level from both reception digital baseband signals and performs an ASK demodulating process. It is therefore possible to solve a problem with a communication hole or a null-point.

<<Nonlinear A/D Converter>>

On the other hand, as shown in FIG. 2, the first high-pass filter 5I and the second high-pass filter 5Q are respectively coupled between the output terminals of the first filter 41 and the second filter 4Q and the input terminals of the first baseband amplifier 6I and the second baseband amplifier 6Q in order to accommodate the differences in voltage between the DC bias voltage levels at the input terminals of the first baseband amplifier 6I and the second baseband amplifier 6Q and the DC voltage levels at the output terminals of the first direct sampling mixer 2I and the second direct sampling mixer 2Q and the output terminals of the first filter 41 and the second filter 4Q.

With the adoption of the adoption of the first high-pass filter 5I and the second high-pass filter 5Q, the following problems have however been revealed by the study of the present inventors et al.

That is, assume that an RF frequency signal having large amplitude is received by the antenna ANT of FIG. 2 from the state in which the amplitude value of the RF frequency signal of 13.56 MHz used in the NFC technology is approximately zero due to the modulation depth of 100%. In such a case, large output voltage fluctuations due to a transient response that responds to a large amplitude input signal occur in the output terminals of the first high-pass filter 5I and the second high-pass filter 5Q.

Figure 8:
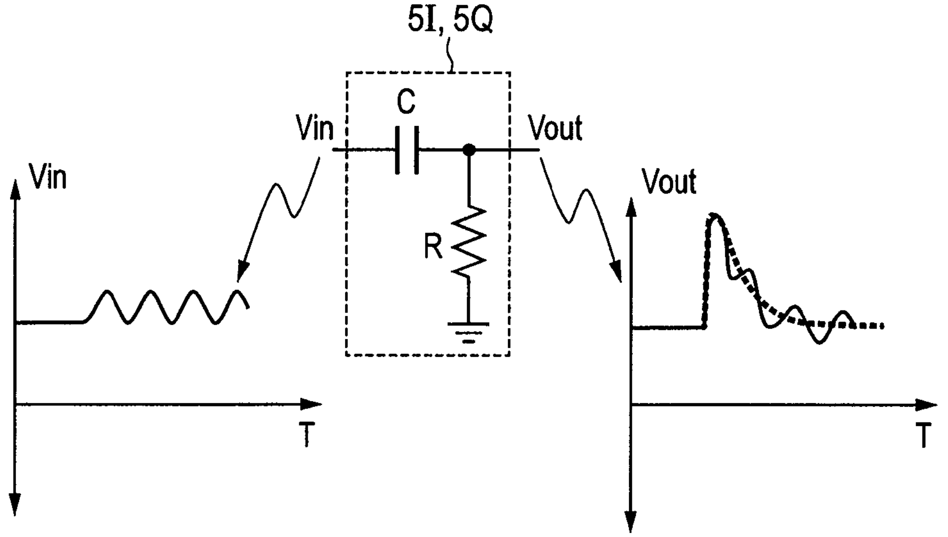
FIG. 8 is a waveform diagram showing a circuit operation of each of a first high-pass filter 5I and a second high-pass filter 5Q of the receiver circuit B5 in the semiconductor integrated circuit B2 according to the first embodiment of the present invention shown in FIG. 2.

FIG. 8 is a waveform diagram showing a circuit operation of each of the first high-pass filter 5I and the second high-pass filter 5Q of the receiver circuit 5B in the semiconductor integrated circuit B2 according to the first embodiment of the present invention shown in FIG. 2.

As shown in FIG. 8, a voltage amplitude value Vin of an RF received frequency input sign al of 13.56 MHz used in the NFC technology changes from an approximately zero state to large amplitude, so that a large output voltage fluctuation occurs in an output voltage Vout of each of the first high-pass filter 5I and the second high-pass filter 5Q due to a transient response. This means that when each of the first high-pass filter 5I and the second high-pass filter 5Q is made up of the capacitor C, resistor R and operational amplifier, larger output voltage fluctuations occur in the outputs of the first high-pass filter 51 and the second high-pass filter 5Q due to the voltage amplifying function of the operational amplifier. Further, the larger output voltage fluctuations in the outputs of the first high-pass filter 5I and the second high-pass filter 5Q are amplified to much larger output voltage fluctuations by the first baseband amplifier 6I and the second baseband amplifier 6Q.

When such a large output voltage fluctuation is supplied to the analog input terminal of the A/D converter 72 through the selector switch 71, there is a possibility that an analog input voltage corresponding to the large output voltage fluctuation will exceed an analog input dynamic range of the A/D converter 72. When the analog input voltage exceeds the analog input dynamic range of the A/D converter 72, a digital output signal accurately proportional to the analog input voltage having a large amplitude period is not generated from the output terminal of the A/D converter 72. It is therefore not possible to perform an accurate data communication between the contactless IC card and the reader-writer device.

On the other hand, when the analog input dynamic range of the A/D converter 72 is extended to an extremely large range to solve such problems, the input sensitivity of the A/D converter 72 lacks where the voltage amplitude value Vin of the RF received frequency input signal of 13.56 MHz used in the NFC technology, which is received by the antenna ANT of FIG. 2, is brought to small amplitude. For this reason, the accurate data communication between the contactless IC card and the reader writer device becomes impossible without the accurate digital output signal being not generated from the output terminal of the A/D converter 72.

Thus, in the receiver circuit B5 of the semiconductor integrated circuit B2 according to the first embodiment of the present invention shown in FIG. 2, the nonlinear A/D converter is used for the A/D converter 72 in particular to solve the problems contradictory to each other.

Figure 9:
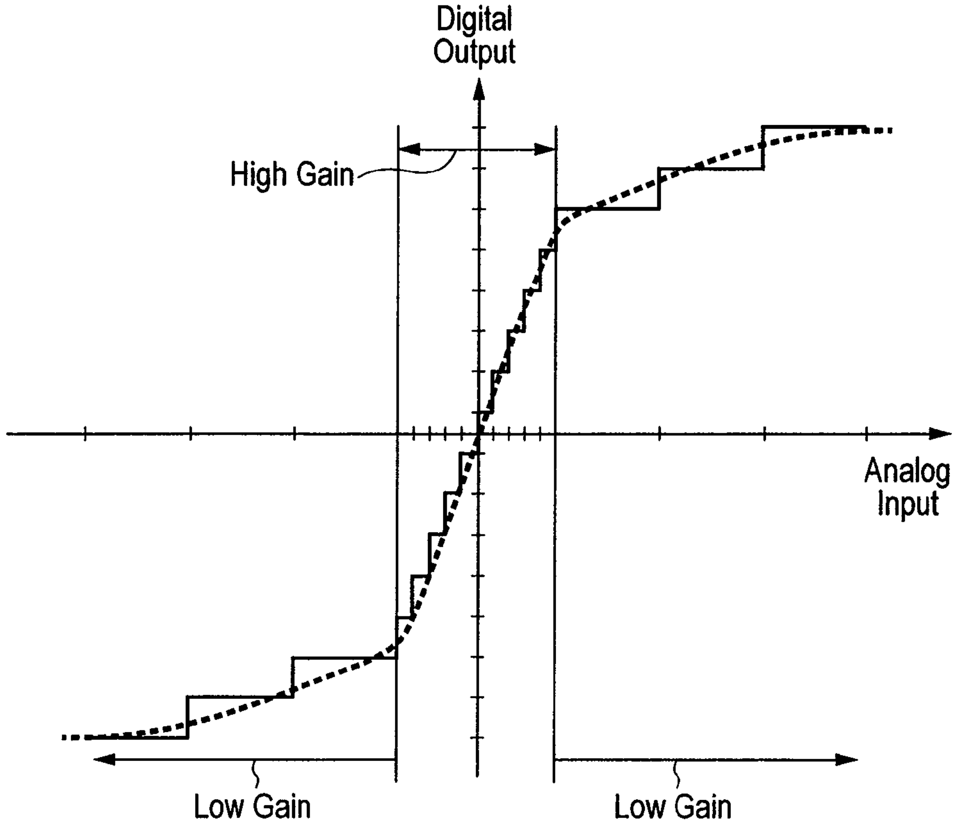
FIG. 9 is a diagram showing input/output characteristics of a nonlinear A/D converter used in an A/D converter 72 of the receiver circuit B5 in the semiconductor integrated circuit B2 according to the first embodiment of the present invention shown in FIG. 2.

FIG. 9 is a diagram showing input/output characteristics of the nonlinear A/D converter used for the A/D converter 72 of the receiver circuit B5 in the semiconductor integrated circuit B2 according to the first embodiment of the present invention shown in FIG. 2.

At a portion where the analog input voltage supplied to the analog input terminal of the A/D converter 72 exists approximately in the center of the analog input dynamic range as shown in FIG. 9, a change in the analog input voltage necessary for the digital output signal to change by one step is set small. On the other hand, at a portion where the analog input voltage is in the neighborhood of the maximum value of the analog input dynamic range on the right side as viewed on the horizontal axis of FIG. 9 or a portion where the analog input voltage is in the neighborhood of the minimum value of the analog input dynamic range on the left side as viewed on the horizontal axis of FIG. 9, a change in the analog input voltage necessary for the digital output signal to change by one step is set large.

Thus, according to the nonlinear characteristics of an analog input voltage vs digital output signal of the A/D converter 72 shown in FIG. 9, the A/D converter 72 operates with high input sensitivity where the analog input voltage becomes small in amplitude and changes at approximately the center of the analog input dynamic range. Therefore, the accurate digital output signal is generated from the A/D converter 72 even if the analog input voltage is small in amplitude, thereby making it possible to perform an accurate data communication between the contactless IC card and the reader-writer device. On the other hand, when the analog input voltage becomes large in amplitude and changes at the portion in the neighborhood of the maximum value or the minimum value of the analog input dynamic range, the A/D converter 72 operates with low input sensitivity. As a result, it is possible to resolve that the analog input voltage easily exceeds the analog input dynamic range. The accurate digital output signal can be generated from the A/D converter 72 even if the analog input voltage is large in amplitude. Thus, the accurate data communication is enabled between the contactless IC card and the reader-writer device.

<<Flash Type Nonlinear A/D Converter>>

FIG. 10 is a diagram showing a configuration of a flash type nonlinear A/D converter 72 according to the first embodiment of the present invention for implementing the nonlinear characteristics of the analog input voltage vs digital output signal of the A/D converter shown in FIG. 9.

As shown in FIG. 10, the flash type nonlinear A/D converter 72 is comprised of a resistor ladder unit 721, a comparator unit 722 and an encoder 723. The resistor ladder unit 721 includes a plurality of resistors coupled in series between a reference voltage Vref and a ground potential. The comparator unit 722 includes a plurality of comparators CP0, CP1 and CP2 through CP9 each having a non-inversion input terminal, an inversion input terminal and an output terminal. An analog input voltage Vin is commonly supplied to the non-inversion input terminals of the comparators CP0, CP1 and CP2 through CP9 of the comparator unit 722. The inversion input terminals of the comparators CP0, CP1 and CP2 through CP9 are supplied with a plurality of comparison reference voltages at connecting nodes of the resistors in the resistor ladder unit 721.

At the flash type nonlinear A/D converter 72 shown in FIG. 10, the five resistors located in the center of the resistor ladder unit 721 are respectively set to a resistance of R−ΔR to bring about high input sensitivity approximately in the center of the input dynamic range. On the other hand, the two resistors at the upper part of the resistor ladder unit 721 and the two resistors at the lower part of the resistor ladder unit 721 are respectively set to a high resistance of R to bring about low input sensitivity.

Comparator output signals corresponding to thermometer codes generated from the outputs of the comparators CP0, CP1 and CP2 through CP9 of the comparator unit 722 are converted into A/D-converted digital output signals $D_0$ through $D_{N-1}$ corresponding to binary codes by the encoder 723, followed by being supplied to the digital signal processor (DSP) 8.

The digital signal processor (DSP) 8 performs a digital correcting process on the nonlinear characteristics of a digital input signal vs digital output signal corresponding to the characteristics opposite to the nonlinear characteristics of the analog input voltage vs digital output signal of the A/D converter 72 shown in FIG. 9 before ASK demodulation, using the digital output signals $D_0$ through $D_{N-1}$ supplied from the A/D converter 72. Executing the digital correcting process by the digital signal processor (DSP) 8 enables compensation for the nonlinear characteristics of the analog input voltage vs digital output signal of the A/D converter 72 shown in FIG. 9.

Second Embodiment

Successive Approximation Type Nonlinear A/D Converter

FIG. 11 is a diagram showing a configuration of a successive approximation type nonlinear A/D converter 72 according to a second embodiment of the present invention for implementing nonlinear characteristics of an analog input voltage vs digital output signal of an A/D converter.

As shown in FIG. 11, the successive approximation type nonlinear A/D converter 72 is comprised of a comparator 724, a successive conversion register 725 and a local D/A converter 726. The comparator 724 performs an analog voltage comparison between an analog input voltage Vin supplied to a non-inversion input terminal thereof and a feedback analog output voltage supplied to an inversion input terminal thereof from the local D/A converter 726. The successive conversion register 725 holds a comparison initial value therein and, on the other hand, updates the held value in response to the result of comparison between high and low levels of the voltage-compared output signal of the comparator 724 in accordance with a predetermined algorithm. Further, the comparison output signal of the comparator 724 is outputted from the successive approximation type nonlinear A/D converter 72 as the A/D-converted digital output signals $D_0$ through $D_{N-1}$, which in turn are supplied to their corresponding input terminals of the local D/A converter 726. Thus, the local D/A converter 726 generates a feedback analog output voltage corresponding to the digital-updated holding value retained in the successive conversion register 725 and supplies it to the inversion input terminal of the comparator 724.

In a related-art general successive approximation type A/D converter, the value held in a successive conversion register is updated in accordance with a predetermined algorithm called a binary search to perform successive approximation type A/D conversion. That is, the comparison initial value of the successive conversion register corresponds to the voltage level approximately at the center of an analog input dynamic range. A feedback analog output voltage set to the voltage level at the center and an analog input voltage are compared by a comparator. When the latter is higher in level than the former, the updated holding value is updated so as to correspond to a voltage level equal to approximately ¾ of the dynamic range. When the latter is lower in level than the former, the updated holding value is updated so as to correspond to a voltage level equal to approximately ¼ the dynamic range. The voltage comparison and the updating of the holding value of the successive conversion register are successively performed in accordance with the above binary search algorithm, whereby the final updated holding value corresponding to the analog input voltage is stored in the successive conversion register, and the A/D-converted digital output signal is generated from the output of the successive conversion register.

In the successive approximation type nonlinear A/D converter 72 according to the second embodiment of the present invention shown in FIG. 11, the holding value of the successive conversion register is updated in accordance with the algorithm for nonlinear binary search to thereby realize the nonlinear characteristics of the analog input voltage vs digital output signal of the A/D converter shown in FIG. 9.

Figure 12:
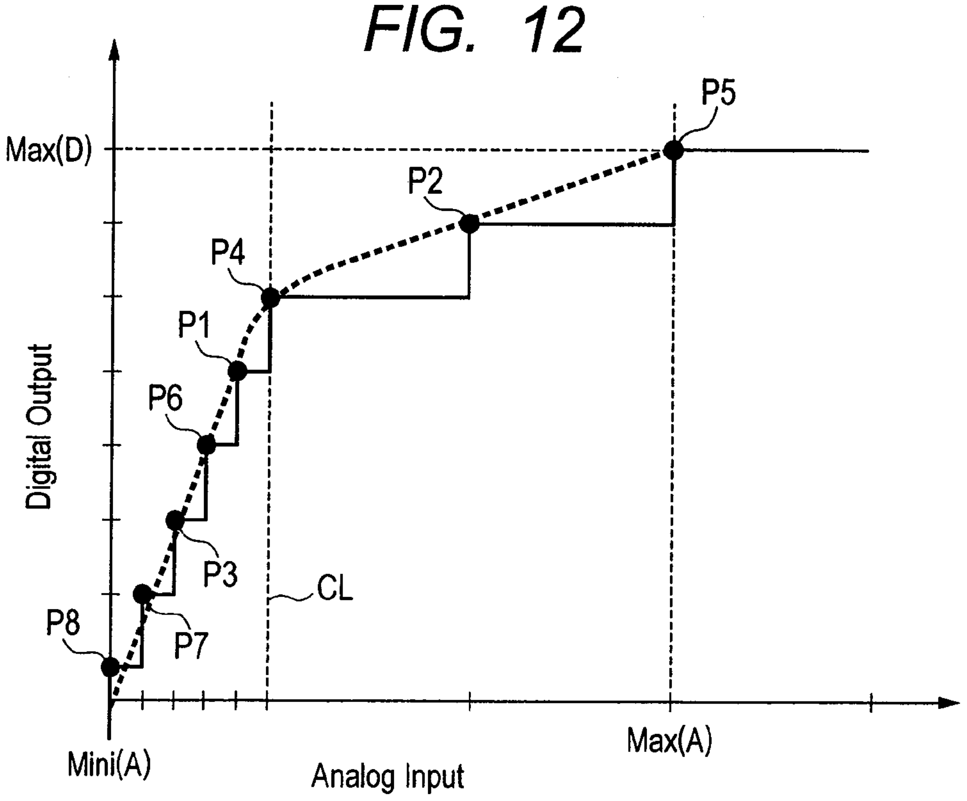
FIG. 12 is a diagram for describing an algorithm for a nonlinear binary search of the successive approximation type nonlinear A/D converter 72 according to the second embodiment of the present invention shown in FIG. 11.

FIG. 12 is a diagram for describing the algorithm for the nonlinear binary search of the successive approximation type nonlinear A/D converter 72 according to the second embodiment of the present invention shown in FIG. 11 and a diagram showing the input/output characteristics of the successive approximation type nonlinear A/D converter 72.

As shown in FIG. 12, according to the algorithm for nonlinear binary search according to the second embodiment of the present invention shown in FIG. 11, a comparison initial value P1 of the successive conversion register 725 is set to the neighborhood of a voltage level corresponding to approximately ¼ of a maximum value Max (A) of an analog input dynamic range without being set to the voltage level corresponding to approximately the center of the related-art general analog input dynamic range. The initial value feedback analog output voltage (comparison initial value P1) set to the neighborhood of the voltage level corresponding to approximately ¼ of the maximum value, and the analog input voltage Vin are compared by the comparator 724. When the latter is higher in level than the former, the next updated holding value P2 is updated so as to correspond to a voltage level equal to approximately ⅔ of the dynamic range. When the latter is lower in level than the former, the next updated holding value P3 is updated so as to correspond to a voltage level equal to approximately ⅓ of the dynamic range.

When the updated holding value is set to the next updated holding value P2 as a result of the first voltage comparison using the comparison initial value P1, the feedback analog output voltage (updated holding value P2) set to the voltage level equal to approximately ⅔ of the dynamic range, and the analog input voltage Vin are compared by the comparator 724 upon a second voltage comparison. When the latter is higher in level than the former, the next updated holding value is updated so as to correspond to approximately the middle between the updated holding value P2 and an updated holding value P5 corresponding to the maximum value Max (A). When the latter is lower in level than the former, the next updated holding value is updated so as to correspond to approximately the middle between the updated holding value P2 and an updated holding value P4 corresponding to a gain change line CL.

When the updated holding value is set to the next updated holding value P3 as the result of the first voltage comparison using the comparison initial value P1, the feedback analog output voltage (updated holding value P3) set to the voltage level equal to approximately ⅓ of the dynamic range, and the analog input voltage Vin are compared by the comparator 724 upon the second voltage comparison. When the latter is lower in level than the former, the next updated holding value is updated so as to correspond to approximately the middle P7 between the updated holding value P3 and an updated holding value P8 corresponding to the minimum value Min (A). When the latter is higher in level than the former, the next updated holding value is updated so as to correspond to approximately the middle P6 between the updated holding value P3 and the comparison initial value P1.

That is, the successive approximation type nonlinear A/D converter 72 according the second embodiment of the present invention shown in FIG. 11 generates the updated holding values P2, P3, . . . and P8 set in accordance with the nonlinear input/output characteristics shown in FIG. 12, in response to the voltage comparison results successively generated from the output of the comparator 724. That is, the successive conversion register 725 includes a state machine thereinside which responds to the voltage comparison results successively generated from the output of the comparator 724 and generates the updated holding values P2, P3, . . . and P8 set in accordance with the nonlinear input/output characteristics shown in FIG. 12, in response to the successively-generated voltage comparison results.

The A/D-converted digital output signals $D_0$ through $D_{N-1}$ generated from the successive conversion register 725 are supplied to the digital signal processor (DSP) 8. The digital signal processor (DSP) 8 performs a digital correcting process on the nonlinear characteristics of a digital input signal vs digital output signal corresponding to the characteristics opposite to the nonlinear characteristics of the analog input voltage vs digital output signal of the A/D converter 72 shown in FIG. 12 before ASK demodulation, using the digital output signals $D_0$ through $D_{N-1}$ supplied from the A/D converter 72. Executing the digital correcting process by the digital signal processor (DSP) 8 enables compensation for the nonlinear characteristics of the analog input voltage vs digital output signal of the A/D converter 72 shown in FIG. 12.

Third Embodiment

Pipeline Type Nonlinear A/D Converter

FIG. 13 is a diagram showing a configuration of a pipeline type nonlinear A/D converter 72 according to a third embodiment of the present invention for implementing nonlinear characteristics of an analog input voltage vs digital output signal of an A/D converter.

As shown in FIG. 13, the pipeline type nonlinear A/D converter 72 is comprised of a pipeline process stage unit 727 and a delay process/digital correction unit 728. The pipeline process stage unit 727 is comprised of a plurality of pipeline stages PS0, PS1, PS2, . . . and PSN−1. Each of the pipeline stages PS0, PS1, PS2, . . . PSN−1 includes, as base elements, a sample-and-hold circuit 10, a sub A/D converter 11, a sub D/A converter 12, a subtractor 13 and an amplifier 14. Further, a voltage level correction circuit 15 is added to the first-stage pipeline stage PS0. Furthermore, a reference voltage switch circuit 16 is added to each of the second-stage pipeline stage PS1 to the last-stage pipeline stage PSN−1.

An input terminal of the sample-and-hold circuit 10 of the first-stage pipeline stage PS0 is supplied with an analog input voltage Vin at an analog input terminal of the pipeline type nonlinear A/D converter 72. An output terminal of the sample-and-hold circuit 10 is coupled to an input terminal of the sub A/D converter 11 and one input terminal of the subtractor 13. An input terminal of the voltage level correction circuit 15 of the first-stage pipeline stage PS0 is supplied with a reference voltage Vref for A/D conversion operation. A correction reference voltage reduced by a predetermined voltage from the reference voltage Vref is generated from an output terminal of the voltage level correction circuit 15 and supplied to the input terminal of the A/D converter 11.

A digital output signal $d_0$ of the most significant bit (MSB) from the sub A/D converter 11 of the first-stage pipeline stage PS0 is supplied to a first input terminal of the delay process/digital correction unit 728 and an input terminal of the sub D/A converter 12. Further, the digital output signal $d_0$ of the most significant bit (MSB) is supplied to the reference voltage switch circuits 16 included in the stages from the second-stage pipeline stage PS1 to the last-stage pipeline stage PSN−1, and the amplifiers 14 included in the stages from the first-stage pipeline stage PS0 to the last-stage pipeline stage PSN−1.

Further, the sub A/D converter 12 of the first-stage pipeline stage PS0 generates a sub D/A analog voltage signal corresponding to the digital output signal $d_0$ of the most significant bit and supplies it to the other input terminal of the subtractor 13. As a result, the subtractor 13 generates a quantization error in difference voltage between the analog input voltage Vin and the sub D/A analog voltage signal and supplies it to an input terminal of the amplifier 14.

When the digital output signal $d_0$ of the most significant bit generated from the sub A/D converter 11 of the first-stage pipeline stage PS0 is of a low level "0", the amplification factor or gain of the amplifier 14 is set to 2 by the digital output signal $d_0$ of the low level, and a reference voltage+Vref on the plus side is selected by the amplifier 14. Thus, a residual signal expressed in the relationship of Vout=2Vin+Vref is generated from the output of the amplifier 14 and supplied to the input terminal of the second-stage pipeline stage PS1. Thus, when the digital output signal $d_0$ of the most significant bit is of the low level "0", the reference voltage switch circuits 16 and the amplifiers 14 included in the stages from the second-stage pipeline stage PS1 to the last-stage pipeline stage PSN−1 are respectively set to the selected state of the reference voltage Vref and the amplified state in which the amplification factor is 2. As a result, assuming that the residual signal supplied from the preceding-stage pipeline stage is Vin' in each of the pipeline stages from the second-stage pipeline stage PS1 to the last-stage pipeline stage PSN−1, a residual signal expressed in the relationship of Vout=2Vin'+Vref is generated and supplied to the input of the next-stage pipeline stage.

When the digital output signal $d_0$ of the most significant bit generated from the sub A/D converter 11 of the first-stage pipeline stage PS0 is of a high level "1", the amplification factor of the amplifier 14 is set to 1 by the digital output signal $d_0$ of the low level, and a reference voltage −Vref on the minus side is selected by the amplifier 14. Thus, a residual signal expressed in the relationship of Vout=Vin−Vref/2 is generated from the output of the amplifier 14 and supplied to the input terminal of the second-stage pipeline stage PS1. Thus, when the digital output signal $d_0$ of the most significant bit is of the high level "1", the reference voltage switch circuits 16 and the amplifiers 14 included in the stages from the second-stage pipeline stage PS1 to the last-stage pipeline stage PSN−1 are respectively set to the selected state of a half reference voltage Vref/2 and the amplified state in which the amplification factor is 1. Thus, assuming that the residual signal supplied from the preceding-stage pipeline stage is Vin' in each of the pipeline stages from the second-stage pipeline stage PS1 to the last-stage pipeline stage PSN−1, a residual signal expressed in the relationship of Vout=Vin'−Vref/2 is generated and supplied to the input of the next-stage pipeline stage.

Figure 14:
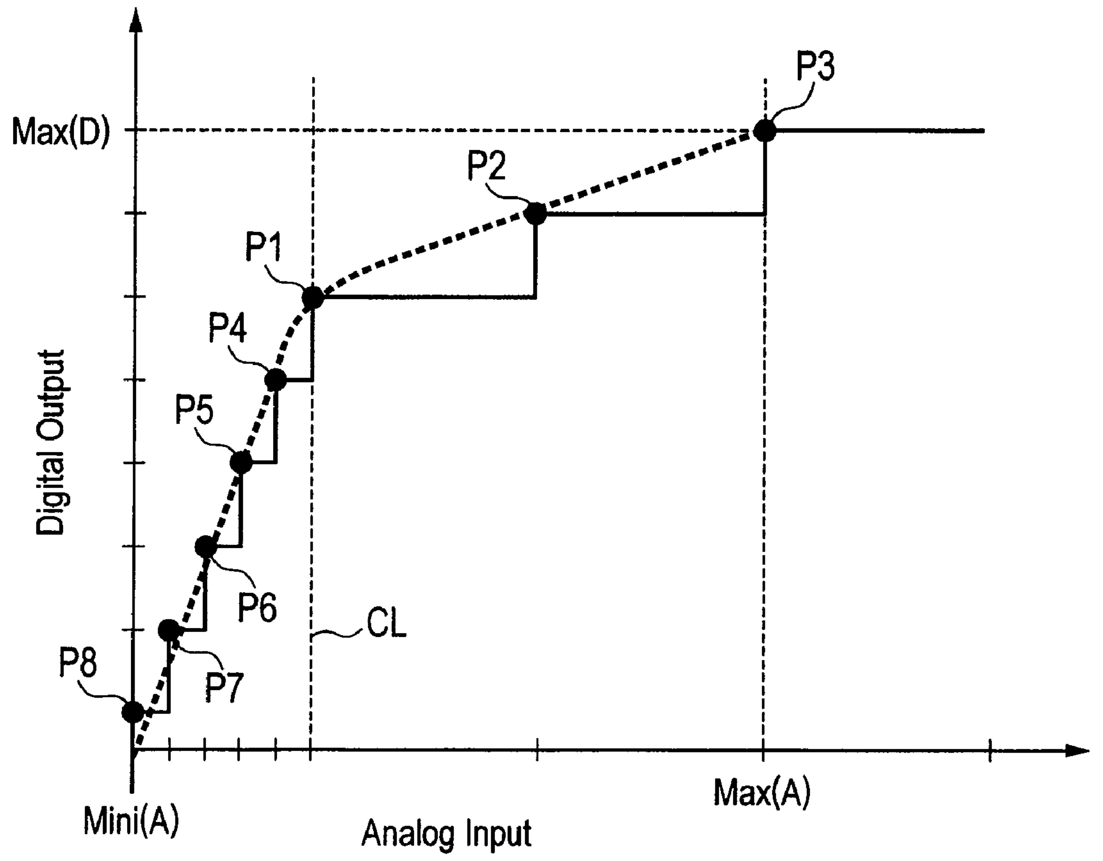
FIG. 14 is a diagram showing an A/D conversion operation and input/output characteristics of the pipeline type nonlinear A/D converter 72 according to the third embodiment of the present invention shown in FIG. 13.

FIG. 14 is a diagram showing an A/D conversion operation and input/output characteristics of the pipeline type nonlinear A/D converter 72 according to the third embodiment of the present invention shown in FIG. 13.

An analog input voltage for the gain change line CL shown in FIG. 14 corresponds to the correction reference voltage generated from the output terminal of the voltage level correction circuit 15 of the first-stage pipeline stage PS0. This correction reference voltage is one reduced by a predetermined voltage from the reference voltage Vref by the voltage level correction circuit 15. As a result, the sub A/D converter 11 of the first-stage pipeline stage PS0 compares the correction reference voltage (CL) that is a level lower than the reference voltage Vref, and the analog input voltage Vin at the analog input terminal of the pipeline type nonlinear A/D converter 72 and outputs the result of comparison as the digital output signal $d_0$ of the most significant bit (MSB).

When the analog input voltage Vin is lower in level than the correction reference voltage (CL), the digital output signal $d_0$ of the most significant bit that is of a low level "0" is generated from the sub A/D converter 11 of the first-stage pipeline stage PS0. Thus, the first-stage pipeline stage PS0 generates a residual signal expressed in the relationship of Vout=2Vin+Vref, whereas each of the stages from the second-stage pipeline stage PS1 to the last-stage pipeline stage PSN−1 generates a residual signal expressed in the relationship of Vout=2Vin'+Vref. Thus, in this case, the pipeline type nonlinear A/D converter 72 according to the third embodiment of the present invention shown in FIG. 13 is operated at an operating point P1 for the gain change line CL shown in FIG. 14 and operating points P4 through P8 located on the left side thereof. As a result, when the analog input voltage Vin becomes small in amplitude and changes at a portion that comes nowhere close to the maximum value Max (A) of the analog input dynamic range in this way, the A/D converter 72 operates with high input sensitivity, so that an accurate digital output signal is generated from the A/D converter 72 even if the analog input voltage is small in amplitude, thereby enabling an accurate data communication between the contactless IC card and the reader writer device.

On the other hand, when the analog input voltage Vin is higher in level than the correction reference voltage (CL), the digital output signal $d_0$ of the most significant bit that is of a high level "1" is generated from the sub A/D converter 11 of the first-stage pipeline stage PS0. Thus, the first-stage pipeline stage PS0 generates a residual signal expressed in the relationship of Vout=Vin−Vref/2, whereas each of the stages from the second-stage pipeline stage PS1 to the last-stage pipeline stage PSN−1 generates a residual signal expressed in the relationship of Vout=Vin'−Vref/2. Thus, in this case, the pipeline type nonlinear A/D converter 72 according to the third embodiment of the present invention shown in FIG. 13 is operated at the operating point P1 for the gain change line CL shown in FIG. 14 and operating points P2 and P3 located on the right side thereof. As a result, when the analog input voltage becomes large in amplitude and changes at an immediately preceding portion that reaches the maximum value Max (A) of the analog input dynamic range, the A/D converter 72 operates with low input sensitivity. For this reason, it is possible to resolve that the analog input voltage easily exceeds the analog input dynamic range. An accurate digital output signal is generated from the A/D converter 72 even if the analog input voltage is large in amplitude. It is thus possible to perform an accurate data communication between the contactless IC card and the reader-writer device.

The delay process/digital correction unit 728 compensates for differences among delay times of a plurality of digital output signals $d_0, d_1, d_2, \ldots d_{N-1}$ generated from the first-stage pipeline stage PS0 to the last-stage pipeline stage PSN−1 provided inside the pipeline process stage unit 727. Thereafter, the delay process/digital correction unit 728 outputs A/D-converted digital output signals $D_0$ through $D_{N-1}$ at which generation timings are arranged, and supplies the same to the corresponding digital signal processor (DSP) 8.

The digital signal processor (DSP) 8 performs a digital correcting process on the nonlinear characteristics of a digital input signal vs digital output signal corresponding to the characteristics opposite to the nonlinear characteristics of an analog input voltage vs digital output signal of the nonlinear type A/D converter 72 shown in FIG. 14 before ASK demodulation, using the digital output signals $D_0$ through $D_{N-1}$ supplied from the delay process/digital correction unit 728 of the pipeline type nonlinear A/D converter 72. As a result, it is possible to compensate for the nonlinear characteristics of the analog input voltage vs digital output signal of the A/D converter 72 shown in FIG. 14 by execution of the digital correcting process by the digital signal processor (DSP) 8. As another embodiment, the digital correcting process on the nonlinear characteristics of the digital input signal vs digital output signal corresponding to the characteristics opposite to the nonlinear characteristics of the analog input voltage vs digital output signal of the nonlinear type A/D converter 72 shown in FIG. 14 may be carried out by the delay process/digital correction unit 728 of the pipeline type nonlinear A/D converter 72 without being performed by the digital signal processor 8.

While the invention made above by the present inventors has been described specifically on the basis of the various embodiments, the present invention is not limited to those. It is needless to say that various changes can be made thereto within the scope not departing from the gist thereof.

For example, the receiver circuit B5 of the semiconductor integrated circuit B2 according to the first embodiment of the present invention shown in FIG. 2 is not limited to the contactless IC cared using the RF frequency signal of 13.56 MHz used in the NFC technology, but may also be used as a receiver circuit such as a battery-operated personal digital assistant or personal data assistance (PDA), a cellular phone, a wireless LAN (Local Area Network), or the like.

What is claimed is:

1. A semiconductor integrated circuit comprising:

a reception mixer; and a signal generator which generates local signals supplied to the reception mixer, wherein the reception mixer is supplied with an RF received signal and the local signals to thereby generate reception mixer output signals, wherein the signal generator includes a multistage delay circuit, a phase detection unit and a clock generation unit, wherein the multistage delay circuit generates a pulse train including a plurality of clock pulse signals different from each other in phase timing by a predetermined delay time in response to a carrier signal included in the RF received signal, wherein the phase detection unit detects differences between a voltage level of a specific clock pulse signal generated in the pulse train generated from the multistage delay circuit, and voltage levels of a predetermined number of clock pulse signals generated prior to the specific clock pulse signal to thereby detect that the specific clock pulse signal has a prescribed phase and generate a detection output signal, wherein the clock generation unit includes a selector and a first signal synthetic logic circuit, wherein the selector outputs a plurality of selection clock pulse signals respectively having a plurality of previously selected phases from the clock pulse signals generated from the multistage delay circuit in response to the detection output signal generated from the phase detection unit, and wherein the first signal synthetic logic circuit performs logical operations on the selection clock pulse signals outputted from the selector to thereby generate the local signals supplied to the reception mixer.

2. The semiconductor integrated circuit according to claim 1, wherein the multistage delay circuit includes a plurality of delay circuits coupled in series, wherein the phase detection unit includes a plurality of flip-flops and a phase detector, wherein the delay circuits of the multistage circuit generate the clock pulse signals of the pulse train and supply the same to the selector and the flip-flops of the phase detection unit, and wherein the phase detector is supplied with a plurality of output signals of the flip-flops to thereby generate the detection output signal and supplies the same to the selector.

3. The semiconductor integrated circuit according to claim 2, wherein a start clock pulsed signal firstly generated in the pulse train generated from the multistage delay circuit is commonly supplied to a plurality of trigger input terminals of the flip-flops.

4. The semiconductor integrated circuit according to claim 1, wherein the reception mixer includes a first reception mixer and a second reception mixer, wherein the phase detection unit detects that the specific clock pulse signal has the prescribed phase that is approximately 180° and generates the detection output signal, wherein the selector outputs in response to the detection output signal generated from the phase detection unit, a first selection clock pulse signal having a phase of approximately 0°, a second selection clock pulse signal having a phase of approximately 45°, a third selection clock pulse signal having a phase of approximately 90° and a fourth selection clock pulse signal having a phase of approximately 135° from the clock pulse signals, wherein a first logic circuit of the first signal synthetic logic circuit performs a first logical operation on the first selection clock pulse signal and the third selection clock pulse signal to thereby generate a first RF local signal supplied to the first reception mixer, and wherein a second logic circuit of the first signal synthetic logic circuit performs a second logical operation on the second selection clock pulse signal and the fourth selection clock pulse signal to thereby generate a second RF local signal supplied to the second reception mixer.

5. The semiconductor integrated circuit according to claim 4, wherein the clock generation unit further includes a second signal synthetic logic circuit which generates a first non-inversion digital clock signal, a first inversion digital clock signal, a second non-inversion digital clock signal and a second inversion digital clock signal in response to the first RF local signal and the second RF local signal, wherein the first reception mixer comprises a first direct sampling mixer operated in response to the first RF local signal, the first non-inversion digital clock signal and the first inversion digital clock signal, and wherein the second reception mixer comprises a second direct sampling mixer operated in response to the second RF local signal, the second non-inversion digital clock signal and the second inversion digital clock signal.

6. The semiconductor integrated circuit according to claim 5, further comprising a carrier detector, a first reset switch transistor and a second reset switch transistor, wherein the first reset switch transistor is coupled between an output terminal of the first direct sampling mixer and a ground potential, wherein the second reset switch transistor is coupled between an output terminal of the second direct sampling mixer and the ground potential, wherein the carrier detector detects an amplitude level of the carrier signal contained in the RF received signal, and wherein when the amplitude level of the carrier signal is reduced to a prescribed amplitude level or less, the carrier detector controls the first reset switch transistor and the second reset switch transistor from a non-conducting state to a conducting state.

7. The semiconductor integrated circuit according to claim 6, further comprising a low noise amplifier coupled to an input terminal of the first direct sampling mixer and an input terminal of the second direct sampling mixer, wherein the low noise amplifier comprises a low noise transconductance amplifier which converts a voltage of the RF received signal into a current, wherein the low noise transconductance amplifier, the first direct sampling mixer and the second direct sampling mixer configures a direct conversion receiver, and wherein a first reception baseband signal is generated from the first direct sampling mixer, and a second reception baseband signal is generated from the second direct sampling mixer.

8. The semiconductor integrated circuit according to claim 7, wherein the low noise transconductance amplifier is capable of amplifying the RF received signal based on a near field communication technology.

9. The semiconductor integrated circuit according to claim 8, further comprising a first high-pass filter, a second high-pass filter, a first baseband amplifier, a second baseband amplifier and an A/D conversion unit, wherein an input terminal of the first high-pass filter and an input terminal of the second high-pass filter are respectively coupled to the output terminal of the first direct sampling mixer and the output terminal of the second direct sampling mixer, wherein an input terminal of the first baseband amplifier and an input terminal of the second baseband amplifier are respectively coupled to an output terminal of the first high-pass filter and an output terminal of the second high-pass filter, wherein an input terminal of the A/D conversion unit is coupled to an output terminal of the first baseband amplifier and an output terminal of the second baseband amplifier, wherein the A/D conversion unit comprises a nonlinear type A/D converter having nonlinear input/output characteristics for adapting to fluctuations in voltage due to transient responses of the output terminal of the first high-pass filter and the output terminal of the second high-pass filter due to a fluctuation in amplitude from a small amplitude of the RF received signal based on the near field communication technology to a large amplitude thereof.

10. The semiconductor integrated circuit according to claim 9, wherein the nonlinear A/D converter comprises any of a flash type nonlinear A/D converter, a successive approximation type nonlinear A/D converter and a pipeline type nonlinear A/D converter.

11. An operating method of a semiconductor integrated circuit comprising a reception mixer, and a signal generator which generates local signals supplied to the reception mixer, the method comprising the steps of:

causing the reception mixer to be supplied with an RF received signal and the local signals to thereby generate reception mixer output signals;

causing the signal generator to include a multistage delay circuit, a phase detection unit and a clock generation unit;

causing the multistage delay circuit to generate a pulse train including a plurality of clock pulse signals different from each other in phase timing by a predetermined delay time in response to a carrier signal included in the RF received signal;

causing the phase detection unit to detect differences between a voltage level of a specific clock pulse signal generated in the pulse train generated from the multistage delay circuit, and voltage levels of a predetermined number of clock pulse signals generated prior to the specific clock pulse signal to thereby detect that the specific clock pulse signal has a prescribed phase and generate a detection output signal;

causing the clock generation unit to include a selector and a first signal synthetic logic circuit;

causing the selector to output a plurality of selection clock pulse signals respectively having a plurality of previously-selected phases from the clock pulse signals generated from the multistage delay circuit in response to the detection output signal generated from the phase detection unit; and causing the first signal synthetic logic circuit to perform logical operations on the selection clock pulse signals outputted from the selector to thereby generate the local signals supplied to the reception mixer.

12. The operating method according to claim 11, comprising the steps of:

causing the multistage delay circuit to include a plurality of delay circuits coupled in series;

causing the phase detection unit to include a plurality of flip-flops and a phase detector;

causing the delay circuits of the multistage circuit to generate the clock pulse signals of the pulse train and supply the same to the selector and the flip-flops of the phase detection unit; and causing the phase detector to be supplied with a plurality of output signals of the flip-flops to thereby generate the detection output signal and supply the same to the selector.

13. The operating method according to claim 12, comprising the step of causing a start clock pulse signal firstly generated in the pulse train generated from the multistage delay circuit to be commonly supplied to a plurality of trigger input terminals of the flip-flops.

14. The operating method according to claim 11, comprising the steps of:

causing the reception mixer to include a first reception mixer and a second reception mixer;

causing the phase detection unit to detect that the specific clock pulse signal has the prescribed phase that is approximately 180° and generate the detection output signal;

causing the selector to output in response to the detection output signal generated from the phase detection unit, a first selection clock pulse signal having a phase of approximately 0°, a second selection clock pulse signal having a phase of approximately 45°, a third selection clock pulse signal having a phase of approximately 90° and a fourth selection clock pulse signal having a phase of approximately 135° from the clock pulse signals;

causing a first logic circuit of the first signal synthetic logic circuit to perform a first logical operation on the first selection clock pulse signal and the third selection clock pulse signal to thereby generate a first RF local signal supplied to the first reception mixer; and causing a second logic circuit of the first signal synthetic logic circuit to perform a second logical operation on the second selection clock pulse signal and the fourth selection clock pulse signal to thereby generate a second RF local signal supplied to the second reception mixer.

15. The operating method according to claim 14, comprising the steps of:

causing the clock generation unit to further include a second signal synthetic logic circuit which generates a first non-inversion digital clock signal, a first inversion digital clock signal, a second non-inversion digital clock signal and a second inversion digital clock signal in response to the first RF local signal and the second RF local signal;

causing the first reception mixer to comprise a first direct sampling mixer operated in response to the first RF local signal, the first non-inversion digital clock signal and the first inversion digital clock signal, and causing the second reception mixer to comprise a second direct sampling mixer operated in response to the second RF local signal, the second non-inversion digital clock signal and the second inversion digital clock signal.

16. The operating method according to claim 15, comprising the steps of:

causing the semiconductor integrated circuit to further comprise a carrier detector, a first reset switch transistor and a second reset switch transistor;

causing the first reset switch transistor to be coupled between an output terminal of the first direct sampling mixer and a ground potential;

causing the second reset switch transistor to be coupled between an output terminal of the second direct sampling mixer and the ground potential;

causing the carrier detector to detect an amplitude level of the carrier signal contained in the RF received signal; and when the amplitude level of the carrier signal is reduced to a prescribed amplitude level or less, causing the carrier detector to control the first reset switch transistor and the second reset switch transistor from a non-conducting state to a conducting state.

17. The operating method according to claim 16, comprising the steps of:

causing the semiconductor integrated circuit to further comprise a low noise amplifier coupled to an input terminal of the first direct sampling mixer and an input terminal of the second direct sampling mixer;

causing the low noise amplifier to comprise a low noise transconductance amplifier which converts a voltage of the RF received signal into a current;

causing the low noise transconductance amplifier, the first direct sampling mixer and the second direct sampling mixer to configure a direct conversion receiver; and causing the first direct sampling mixer to generate a first reception baseband signal; and causing the second direct sampling mixer to generate a second reception baseband signal.

18. The operating method according to claim 17, comprising the step of allowing the low noise transconductance amplifier to amplify the RF received signal based on a near field communication technology.

19. The operating method according to claim 18, comprising the steps of:

causing the semiconductor integrated circuit to further comprise a first high-pass filter, a second high-pass filter, a first baseband amplifier, a second baseband amplifier and an A/D conversion unit;

coupling an input terminal of the first high-pass filter and an input terminal of the second high-pass filter to an output terminal of the first direct sampling mixer and an output terminal of the second direct sampling mixer respectively;

coupling an input terminal of the first baseband amplifier and an input terminal of the second baseband amplifier to an output terminal of the first high-pass filter and an output terminal of the second high-pass filter respectively;

coupling an input terminal of the A/D conversion unit to an output terminal of the first baseband amplifier and an output terminal of the second baseband amplifier; and causing the A/D conversion unit to comprise a nonlinear type A/D converter having nonlinear input/output characteristics for adapting to fluctuations in voltage due to transient responses of the output terminal of the first high-pass filter and the output terminal of the second high-pass filter due to a fluctuation in amplitude from a small amplitude of the RF received signal based on the near field communication technology to a large amplitude thereof.

20. The operating method according to claim 18, comprising the step of causing the nonlinear A/D converter to comprise any of a flash type nonlinear A/D converter, a successive approximation type nonlinear A/D converter and a pipeline type nonlinear A/D converter.

* * * * *